(12) United States Patent
Akiyama et al.

(10) Patent No.: US 7,995,405 B2
(45) Date of Patent: Aug. 9, 2011

(54) SEMICONDUCTOR MEMORY DEVICE HAVING A SENSE AMPLIFIER CIRCUIT WITH DECREASED OFFSET

(75) Inventors: Satoru Akiyama, Sagamihara (JP); Tomonori Sekiguchi, Tama (JP); Riichiro Takemura, Tokyo (JP); Hiroaki Nakaya, Kokubunji (JP); Shinichi Miyatake, Tokyo (JP); Yuko Watanabe, Tokyo (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/967,728

(22) Filed: Dec. 14, 2010

(65) Prior Publication Data

US 2011/0079858 A1   Apr. 7, 2011

Related U.S. Application Data

(62) Division of application No. 11/969,223, filed on Jan. 3, 2008, now Pat. No. 7,876,627.

(30) Foreign Application Priority Data

Jan. 9, 2007   (JP) .................................. 2007-001455

(51) Int. Cl.
*G11C 7/06* (2006.01)

(52) U.S. Cl. .............. 365/189.15; 365/189.05; 365/208; 365/207; 365/205; 365/196; 365/190

(58) Field of Classification Search ............. 365/189.15, 365/189.05, 189.11, 208, 207, 205, 196, 365/195, 190
See application file for complete search history.

(56) References Cited

U.S. PATENT DOCUMENTS

| | | | |
|---|---|---|---|
| 5,835,427 A | 11/1998 | McClure | |
| 6,226,207 B1 | 5/2001 | Suh | |
| 6,392,303 B2 | 5/2002 | Keeth | |
| 6,456,543 B1 | 9/2002 | Lee | |
| 7,876,627 B2* | 1/2011 | Akiyama et al. | 365/189.15 |
| 2002/0075731 A1 | 6/2002 | Amano | |
| 2004/0223393 A1 | 11/2004 | Hush et al. | |
| 2005/0232044 A1 | 10/2005 | Akiyama et al. | |

FOREIGN PATENT DOCUMENTS

| | | |
|---|---|---|
| JP | 63-244397 | 10/1988 |
| JP | 04-319596 | 11/1992 |
| JP | 08-235863 | 9/1996 |
| JP | 08-287681 | 11/1996 |
| JP | 11-265577 | 9/1999 |
| JP | 2005-293759 A | 10/2005 |

OTHER PUBLICATIONS

Itoh et al., "VLSI Memory Chip Design," Springer, 2001, pp. 223-230.
Hong et al., "An Offset Cancellation Bit-line Sensing Scheme for Low-Voltage DRAM Applications," ISSCC 2002 IEEE International Solid-State Conference, Digest of Technical Papers, pp. 154-155.
Sim et al., "Charge-Transferred Presensing and Efficiently Precharged Negative Word-Line Schemes for Low-Voltage DRAMs," 2003 Symposium on VLSI Circuits Digest of Technical Papers, 2003, p. 289-292.

* cited by examiner

*Primary Examiner* — Andrew Q Tran
(74) *Attorney, Agent, or Firm* — Miles & Stockbridge P.C.

(57) ABSTRACT

A semiconductor memory device having high integration, low power consumption and high operation speed. The memory device includes a sense amplifier circuit having plural pull-down circuits and a pull-up circuit. A transistor constituting one of the plural pull-down circuits has a larger constant than that of a transistor constituting the other pull-down circuits, for example, a channel length and a channel width. The pull-down circuit having the larger constant transistor is activated earlier than the other pull-down circuits and the pull-up circuit, which are activated to conduct reading. The data line and the earlier driven pull-down circuit are connected by an NMOS transistor and the NMOS transistor is activated or inactivated to control the activation or inactivation of the pull-down circuit.

5 Claims, 21 Drawing Sheets

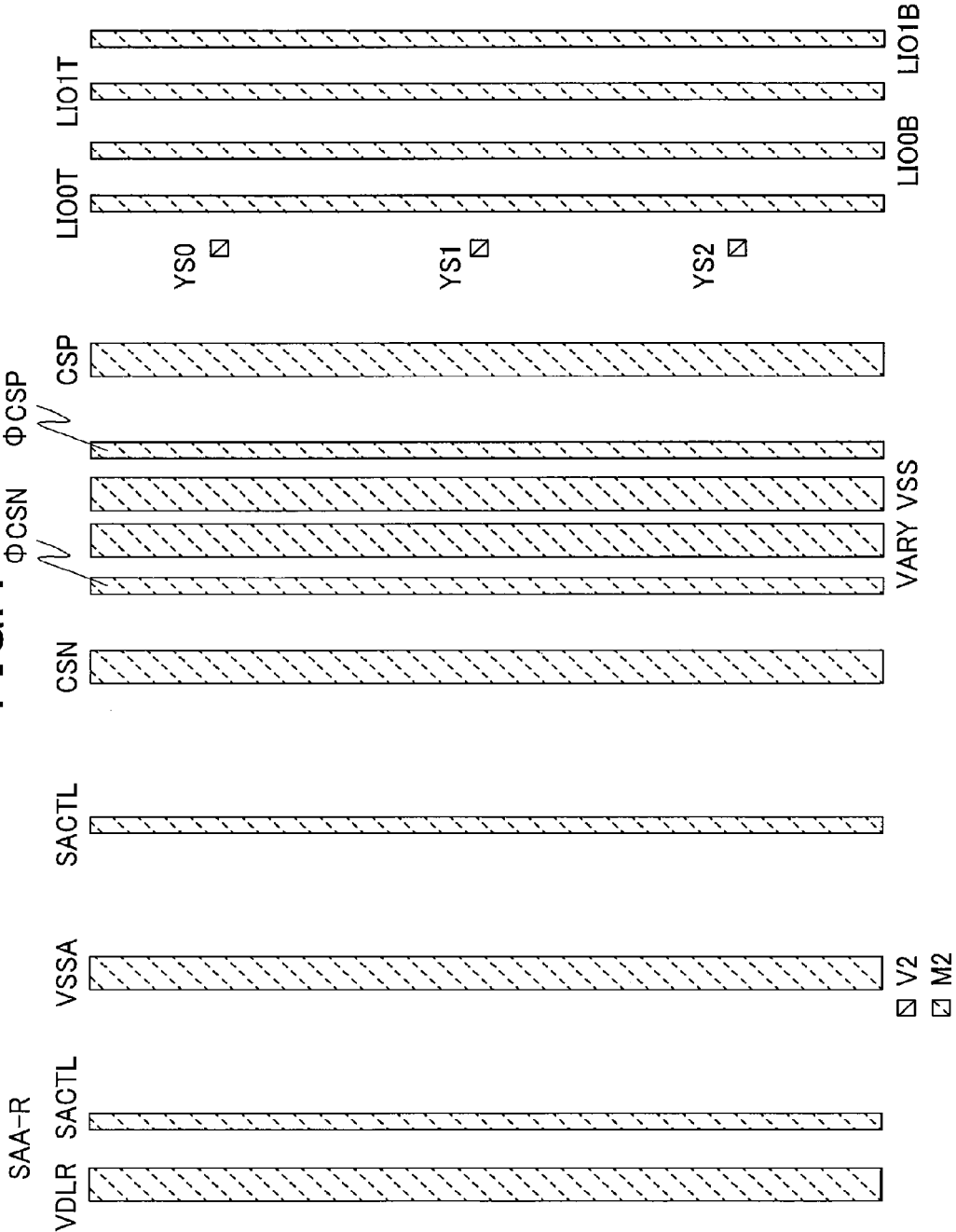

SEMICONDUCTOR MEMORY DEVICE HAVING A SENSE AMPLIFIER CIRCUIT WITH DECREASED OFFSET

CLAIM OF PRIORITY

This application is a division of application Ser. No. 11/969,223 filed Jan. 3, 2008 now U.S. Pat. No. 7,876,627. The present application also claims priority from Japanese application JP 2007-001455, filed on Jan. 9, 2007, the content of which is hereby incorporated by reference into this application.

BACKGROUND OF THE INVENTION

1. Field of the Invention

The present invention concerns a semiconductor device and a manufacturing method thereof and, in particular, it relates to a high speed and highly integrated semiconductor memory device, and a portion of a differential amplification section of a semiconductor device in which a logic circuit and a semiconductor memory device are integrated.

2. Description of the Related Arts

Dynamic random access memories (hereinafter referred to as DRAM) are semiconductor memory devices that can be mounted in various commonly used electronic equipment. Further, along with requirements for less power consumption and higher performance of equipment in recent years, there has been a strong demand for DRAM having higher performance such as a decrease in the power consumption, an increase in the operation speed and an increase in the capacity.

One of most effective means for attaining a high performance DRAM is to scale down a memory cell. The memory cell becomes small by scaling down. As a result, the length of a word line and a data line connected to a memory cell is shortened. That is, since the parasitic capacitance in the word line and the data line can be decreased, low voltage operation is possible and lower power consumption can be attained. Further, since the size of the memory cell is small, the capacity of the memory can be increased to attain higher performance of equipment. As described above, the scaling down contributes much to the increase in the performance of DRAM.

However, along with the progress of the scaling down to 65-nm node, 45-nm node, etc., various side effects have resulted in addition to enhancing the performance described above. The main side effect is an increase in the fluctuation of device characteristics caused by the scale down. The fluctuation of the device characteristics includes dispersion for the value of the threshold voltage of transistors and leakage current flowing from the transistors (deviation from average values). Since the fluctuation in the devices causes degradation of the DRAM performance, it is desirable to suppress the device fluctuation as much as possible. Particularly, a fluctuation of the differences of the threshold voltage of a pair of transistors in a sense amplifier circuit results in a noise source for the sense amplification operation that amplifies a small signal which causes reading error. That is, fluctuation of the threshold voltage of the sense amplifier gives a direct effect on the yield of chips.

Since the data line pitch of DRAM is usually narrowed along with the scaling down, it is also necessary that the layout pitch of the sense amplifiers is narrowed corresponding to the data line pitch. As a result, the channel length is shortened and the channel width is narrowed in the transistor, so that the manufacturing error of transistors constituting the sense amplifier increases. This manufacturing error increases the fluctuation of the difference of threshold voltage between the pair of transistors. Generally, the problem is referred to as an offset problem of a sense amplifier which is one of factors giving a significant effect on the access speed tRCD (RAS TO CAS DELAY) of DRAM. Further, the offset problem of the sense amplifier is described in details by Kiyoo Itoh, in "VLSI Memory Chip Design", Springer, 2001, pp 223-230. It has been well known that a decrease of offset contributes very much to the improvement of the yield for DRAM. Accordingly, for attaining higher performance by scaling down, an extremely important technique includes decreasing the manufacturing error by the improvement in the process and taking a circuit countermeasure for suppressing the sense amplifier offset.

As an example in recent years of attempting to solve such a problem, a technique of compensating for the offset of the sense amplifier is disclosed by Sang Hoon Hong, et al., in ISSCC 2002 Digest of Technical Papers, pp 154-155. According to the method, the offset of a sense amplifier can be substantially decreased by compensating a precharge voltage of a data line using a current mirror operation amplifier. However, this method greatly increases the number of elements added to the sense amplifier, increases the area of the sense amplifier, and results in an increase of the chip size. Further, since driving control signals are also increased, a timing margin increases and the operation speed may possibly be lowered as well.

Further, a charge transfer type sense amplifier is disclosed by Jae-Yoon Simm, et al., 2003 Symposium on VLSI Circuits Digest of Technical Papers, pp 289-292. This is a method of transferring charges accumulated in a peripheral circuit such as a sense amplifier to the data line on the side of the memory cell by way of a switching transistor connected with the data line, in order to generate a high potential difference in the sense amplifier. Therefore, even in a case where the offset of the sense amplifier increases, since the higher potential difference than the offset can be applied to the sense amplifier, this amplifier is essentially stable with respect to the fluctuation and performs well in low voltage operation. However, the method also increases the number of elements to be added such as additional precharge circuitry and a rewriting switching transistor to leave a problem of resulting in which results in an increase in chip size.

Further, U.S. Pat. No. 6,392,303B2 discloses a sense amplifier circuit that includes adding two NMOS cross couples to an existent cross couple. In the added NMOS cross couples, the gate of the NMOS transistor on one side and the drain of the NMOS transistor on the other side are connected by way of a shared switch. It is described that this can attain high speed sensing operation. In this system, the on resistance of the shared switch is eliminated effectively from the NMOS cross couple and the rewriting operation speed can be increased. However, in the sensing operation upon reading, it undergoes the effect of the offset of the existent cross couple. Accordingly, in a case where the offset in the existent cross couple is large, this may possibly cause reading error.

On the other hand, Japanese Unexamined Patent Application Publication No. 2005-293759 discloses a sense amplifier circuit with a smaller number of additional devices and a decreased offset in the sense amplifier. This method solves the problem of the sense amplifier offset by adding an NMOS cross couple having a highly sensitive pre-amplifier function. Further, the number of the devices to be added is as small as two and the overhead area is also small.

SUMMARY OF THE INVENTION

As a result of the study made by the present inventor on the sense amplifier circuit in Japanese Unexamined Patent Application Publication No. 2005-293759, it has been found that the following problems are present.

According to Japanese Unexamined Patent Application Publication No. 2005-293759, a small signal read on a bit line is pre-amplified by an additional NMOS cross couple and then data is latched by existent NMOS and PMOS cross couples. In this case, in an NMOS transistor in which a data line pulled up to a high level is connected from the drain to the common source, a subthreshold leakage current flows from the drain side to the common source side. In Japanese Unexamined Patent Application Publication No. 2005-293759, one NMOS cross couple is added to a general sense amplifier circuit. Accordingly, this increases the flow path in which a subthreshold leakage current flows. As a result, this involves a problem of increasing the off leakage for the entire chip upon data latching.

In view of the foregoing problem, the present invention intends (1) to realize a sense amplifier circuit with decreased offset of the sense amplifier to increase the operation speed in view of the access time tRCD and (2) to decrease the subthreshold leakage flowing from the sense amplifier to decrease the chip consumption current.

The foregoing, as well as other objects and novel features of the invention will become apparent according to the descriptions of the specification and the appended drawings.

The outline of typical examples among those disclosed in the present application is simply described as below.

In a semiconductor memory device including plural memory cells and plural sense amplifier circuits, the sense amplifier circuit has at least two or more pull-down circuits. Further, one of the pull-down circuits is driven precedingly. The precedingly driven pull-down circuit and the data line are connected by way of an NMOS transistor. After outputting the amount of read signal to the data line, the NMOS transistor is driven to drive the pull-down circuit. After amplifying the data line by the pull-down circuit to higher than the offset of the pull-down circuit and the pull-up circuit in the succeeding stage, the pull-down circuit in the succeeding stage and the pull-up circuit in the succeeding stage are driven. In this case, in the precedingly driven pull-down circuit, the channel length and the channel width of the transistor are preferably made larger in advance so that the offset of the transistor is decreased.

Further, after latching the data by the sense amplifier, the NMOS transistor is inactivated to inactivate the precedingly driven pull-down circuit. This can decrease subthreshold leakage current flowing from the precedingly driven pull-down circuit. The sense amplifier may also be constituted with plural pull-up circuits.

Referring briefly to the effect obtained by typical inventions among those disclosed in the present application, it is possible to attain high speed access time or low consumption of current.

BRIEF DESCRIPTION OF THE DRAWINGS

FIG. 4 is an example of a planar layout of a sense amplifier circuit succeeding to FIG. 2;

DETAILED DESCRIPTION OF THE PREFERRED EMBODIMENTS

The present invention is to be described specifically by way of preferred embodiments with reference to the drawings. Throughout the drawings for explaining the preferred embodiments, identical members carry identical references for which duplicate descriptions are omitted as a rule.

Further, transistors constituting each of the blocks shown in the embodiments are not particularly restricted, and they are formed on one semiconductor substrate such as made of single crystal silicon by a known integration circuit technology such as CMOS (Complementary MOS Transistor). That is, they are formed by steps including a step of forming a well, a device isolation region, and an oxide film and, subsequently, and a step of forming first and second semiconductor regions forming a gate electrode and a source-drain region.

Circuit symbols for MOSFET (Metal Oxide Semiconductor Field Effect Transistor) are distinguished such that those not having a circle on the gates represent N-type MOSFET (NMOS) while those having a circle on the gates represent P-type MOSFET (PMOS). Hereinafter, the MOSFET is simply referred to as MOS or MOS transistor.

The invention is not restricted only to an field effect transistor containing an oxide film disposed between a metal gate and a semiconductor layer but is applicable to circuits using general FET such as MISFET (Metal Insulator Semiconductor Field Effect Transistor) containing an insulative film therebetween.

Embodiment 1

A semiconductor memory device and a sense amplifier circuit thereof as an embodiment of the invention are to be described.

Figure 1:
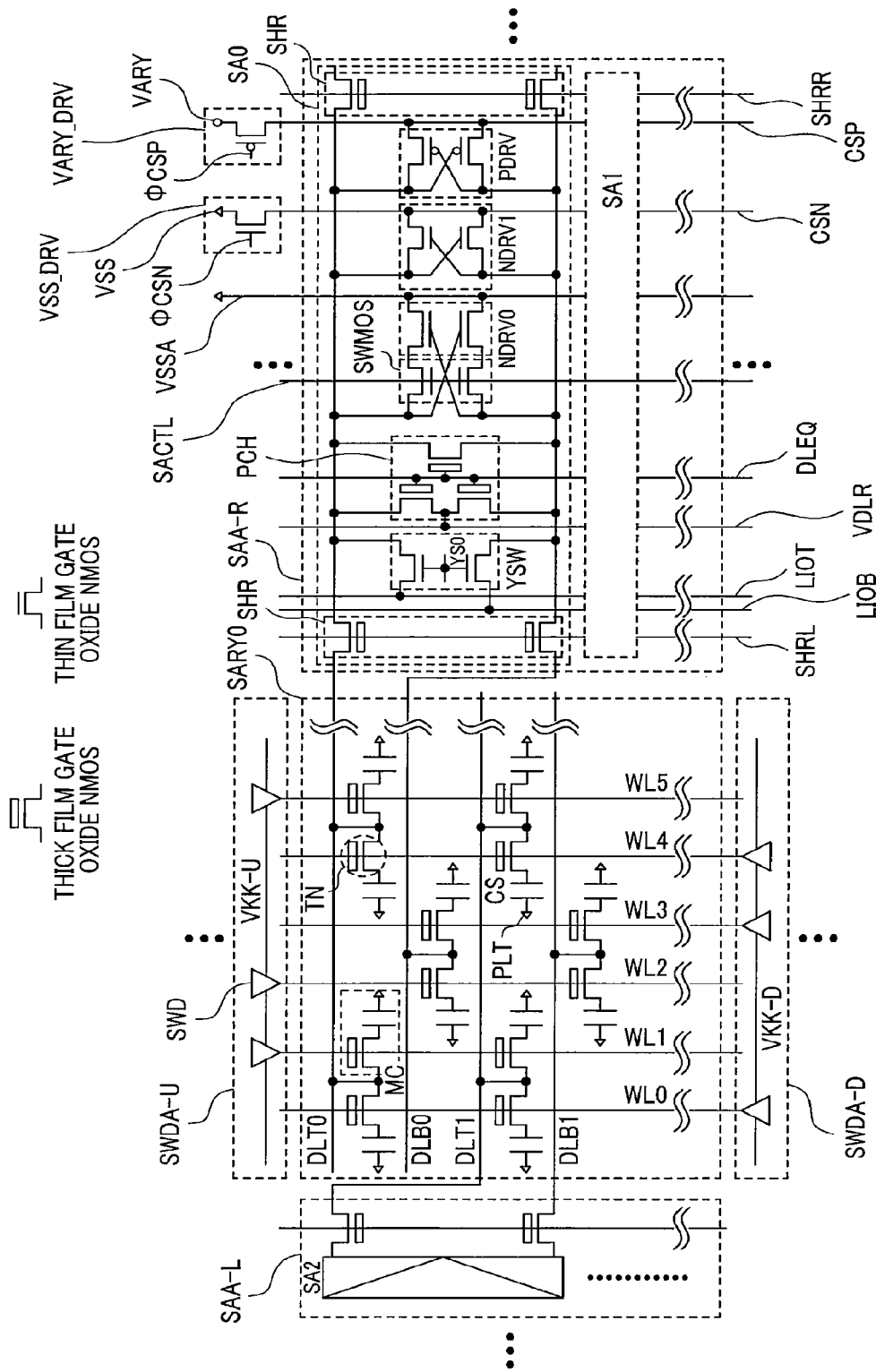
FIG. 1 is a circuit diagram for a memory array of a semiconductor memory device and a sense amplifier as an embodiment of the invention.

FIG. 1 is a view showing a sense amplifier circuit SA0 and plural memory cells MC connected therewith as a first embodiment of the invention. The sense amplifier circuit SA0 includes two pull-down circuits NDRV0 and NDRV1, one pull-up circuit PDRV, a column switch YSW, a precharge circuit PCH, and a shared switch SHR. Further, respective symbols represent switching transistors SWMOS controlling the connection of the pull-down circuit NDRV0 and a data line, a control signal SACTL for driving the switching transistor SWMOS, a source line VSSA for the pull-down circuit NDRV0, a common source driver VSS_DRV for driving the pull-down circuit NDRV1, a common source control switch φCSN for controlling the common source driver VSS_DRV, a common source line CSN for the pull-down circuit NDRV1, a common source driver VARY_DRV for driving the pull-up circuit PDRV, a common source control switch φCSP for controlling the common source driver VARY_DRV, a common source line CSP for the pull-up circuit PDRV, shared switch control lines SHRR, SHRL, a column switch control line YS, local input/output lines LIOT, LIOB, a precharge voltage VDLR, a precharge circuit control line DLEQ, a ground voltage VSS, a data line high level voltage VARY, sense amplifier circuits SA1, SA2, sense amplifier arrays SAA-R, SAA-L, a sub-word driver SWD, sub-word driver arrays SWDA-U, SWDA-D, negative voltages VKK-U, VKK-D, data lines DLT0, DLT1, DLB0, DLB1, sub-word lines WL0, WL1, WL2, WL3, WL4, WL5, a memory cell MC, an Access transistor TN, a cell capacitance CS, a plate electrode PLT, thick film NMOS transistor Thick film NMOS, a thin film NMOS transistor Thin film NMOS. Further, some device circuits or wirings such as precharge circuit for the common source, local input/output lines LIOT1, LIOB1 are omitted for the simplicity of the drawings.

As shown in FIG. 1, in the plural pull-down circuits in this embodiment, NMOS transistors constituting the pull-down circuit NDRV0 has a longer channel length and a wider channel width of the transistor when compared with the NMOS transistor constituting the pull-down circuit NDRV1. The channel length is made longer and the channel width is made wider in the transistor in order to decrease the threshold voltage difference between NMOS cross couple transistors in the pull-down circuit NDRV, that is, for reducing the offset of the pull-down circuit NDRV0. Since the offset of the pull-down circuit NDRV0 is small, when the pull-down circuit NDRV0 is driven precedingly to the pull-down circuit NDRV1 and the pull-up circuit PDRV, a small amount of read signal outputted to the data line can be amplified accurately. It is preferred that the channel length is shorter or the channel width is wider for the NMOS transistor constituting the pull-down circuit NDRV1 and the PMOS transistor constituting the pull-up circuit PDRV. The reason is as described below. Since the channel length is long and the channel width is wide in the NMOS transistor constituting the pull-down circuit NDRV0, the speed for driving the data line to the ground level is sometimes lowered. In such a case, by making the channel length shorter and the channel width wider for the transistor constituting the pull-down circuit NDRV1 and the pull-up circuit PDRV, the data line can be amplified at a high speed to a ground level and to a desired high level. As described above, by adding the pull-down circuit NDRV0 with the transistor constant (channel length or channel width) being increased to sufficiently decrease the offset and driving the same preceding to the pull-down circuit NDRV1 or the pull-up circuit PDRV, the small amount of the read signal outputted to the data line upon reading can be amplified to higher than the offset voltage of the pull-up circuit NDRV1 and the pull-down circuit PDRV. That is, even when the fluctuation of the threshold voltage of the transistor increases by scaling down and the voltage on the data line is lowered, the amount of the read signal upon sensing can be amplified correctly.

When the sense amplifier circuit SA0 of Embodiment 1 is compared with the existent sense amplifier circuit, the additional circuit thereof has only four NMOS transistors in total, that is, a pair of NMOS cross couples and two NMOS transistors connecting the NMOS cross couples with the data line. Accordingly, the area overhead of the sense amplifier circuit SA0 in this embodiment is extremely small and the increase of the chip size can be minimized. Further, since the portions other than the additional circuit are identical with those in the existent sense amplifier, change of the layout and the wiring constitution, etc. can also be minimized. In the embodiment shown in FIG. 1, while a folded data line array constitution where the data line pair intersects to the sub-word line is shown, the invention is not restricted to the same. For example, it may be a so-called open data line array constitution. Further, while the threshold voltage for the pull-down circuits NDRV0, NDRV1 and the pull-up circuit PDRV is not particularly referred to, the threshold voltage may be a low threshold voltage lower than the threshold voltage of general thin film transistors utilized, for example, to the decoder XDEC of the row address. The sensing speed can be made higher by utilizing a thin film transistor of low threshold voltage specification because the driving current for the pull-down circuit or the pull-up circuit is improved. As described above, various modifications are naturally possible within a range not departing the gist of the invention.

Figure 2:
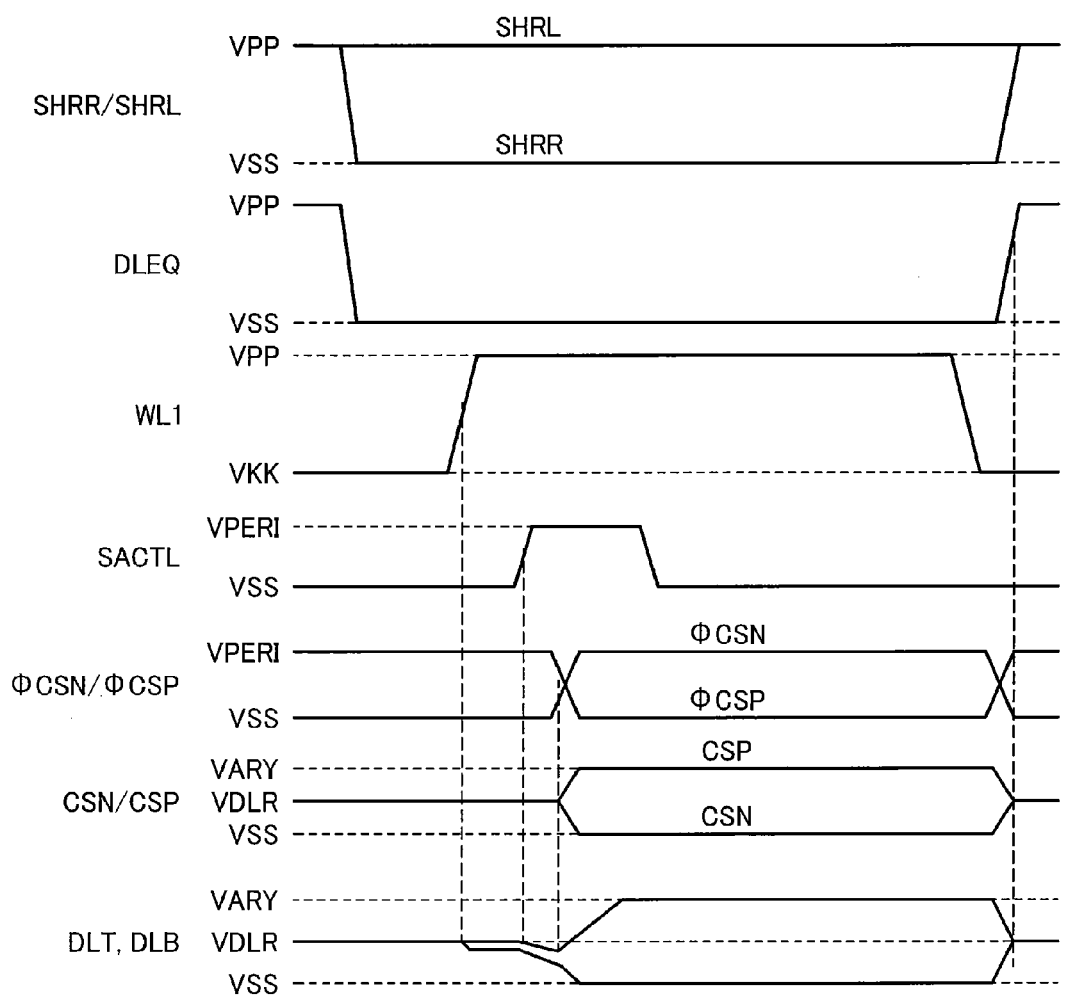
FIG. 2 is an example for the operation waveform of the sense amplifier circuit in FIG. 1.

FIG. 2 is an operation waveform of the sense amplifier circuit SA0 of the embodiment of FIG. 1. At first, for electrically disconnecting the array on the non-selection side and the sense amplifier circuit SA0, the shared switch SHRR is negated from a raised voltage VPP to a ground voltage VSS. Substantially simultaneously, the precharge circuit control line DLEQ is negated to inactivate the precharge circuit PCH in the sense amplifier circuit SA0. Thus, only the sense amplifier in common with the sub-array and the selection sub-array are electrically connected. Further, the data line in a precharge state goes to a floating state to enable reading. While there are various methods of negating the shared switch SHRR and driving the precharge circuit control line DLEQ, a row address signal RAS or an address signal may be utilized, for example. Then, when the sub-word line WL1 is asserted, a retained signal is outputted from the memory cell connected with the sub-word line WL1 to the data line. For example, a signal at an L level held in the memory cell MC in FIG. 1 is outputted to the data line. The amount of the outputted read signal is inputted to each of the gates of the pull-down circuit NDRV0. Then, the switching transistor SWMOS is driven preceding to the pull-down circuit NDRV1 and the pull-up circuit PDRV. When the switching transistor SWMOS is activated precedingly, since the pull-down circuit NDRV0 and the data line are connected electrically, amplification for the small amount of the read signal outputted to the data line is started.

As explained for FIG. 1, the offset of the pull-down circuit NDRV0 is extremely small. Accordingly, the small amount of the read signal read out to the data line can be amplified correctly. That is, the data line DLT0 to which the amount of read signal at the L level is outputted can be driven selectively on the VSS side. Further, since the pull-down circuit NDRV1 and the pull-up circuit PDRV are still in the non-activated state, even when the offset of the pull-down circuit NDRV1 and pull-up circuit PDRV is large, this may not give an undesired effect on the sending operation. Further, since the switching transistor SWMOS is utilized as the control circuit for the pull-down circuit NDRV0, the source of the pull-down circuit NDRV0 can be at the ground level. Setting of the source to the ground level leads to strengthening of the source potential. When the source potential is strengthened in a state where the offset of the pull-down circuit NDRV0 is sufficiently decreased, since a current flowing in the cross couple also increases, this provides, as a result, an advantage capable of increasing the sensing speed of the pull-down circuit NDRV0. As described above, when the small amount of the read signal that is read out is amplified to higher than the offset of the pull-down circuit NDRV1 and the pull-up circuit PDRV to be driven subsequently by precedingly driving the pull-down circuit NDRV0, stable reading operation is possible even when the fluctuation of the threshold voltage increases.

After amplifying the data line pair to a desired voltage difference, common source control switch φCSN and φCSP are asserted to change common source lines CSN and CSP to VSS and VARY levels respectively. Thus, the data line pair is amplified to the VSS level and the VARY level and latched by the sense amplifier circuit SA0. In this case, a subthreshold leakage current flows to VSSA on the source of the NMOS transistor in which the data line DLB0 latched at the VARY level is connected to the drain in the NMOS transistors constituting the pull-down circuit NDRV0. In order to avoid this, the switching transistor SWMOS is negated after amplifying the data line pair to VSS and VARY levels. By negating the switching transistor SWMOS, the subthreshold leakage current described above can be decreased. That is, the subthreshold leakage current of the sense amplifier circuit SA0 can be decreased to decrease the consumption current of the chip.

After latching the data line pair to a desired voltage potential and inactivating the switching transistor SWMOS, data is latched by the pull-down circuit NDRV1 and the pull-up circuit PDRV and rewriting operation is conducted to the memory cell MC. After the data is written back sufficiently to the memory cell MC, the sub-word line WL1 is negated. Then, the common source lines CSN and CSP are precharged to the precharge voltage VDLR, the precharge control line DLEQ is asserted, and the data line pair is precharged to the precharge potential VDLR. The operation of the sense amplifier circuit SA0 in Embodiment 1 is as has been described above.

As explained so far, by adding the pull-down circuit NDRV0 with the offset being decreased sufficiently, stable reading operation can be attained also in a case where the fluctuation of the threshold voltage is large or the amount of the read signal is decreased by lowering of the voltage. Further, since the operation at low voltage is enabled, chip consumption power during operation can be decreased. Further, in the existent sense amplifier circuit, when the data line length is made longer, the parasitic capacitance in the data line increases to possibly decrease the amount of the read signal and generate erroneous operation in the reading. However, by using the sense amplifier circuit SA0 of the invention, even when the data length is made longer, erroneous reading operation does not occur by precedingly driving the pull-down circuit NDRV0 with the offset being decrease sufficiently. That is, it is possible to make the stable reading operation and the improvement for the cell occupation ratio of the chip compatible. An increase in the cell occupation ratio can decrease the chip area and provides good chips at a low cost. Further, by inactivating the switching transistor SWMOS after data latch, the subthreshold leakage current flowing in the pull-down circuit NDRV0 can be decreased. As a result, the chip consumption current can be decreased.

Figure 3:
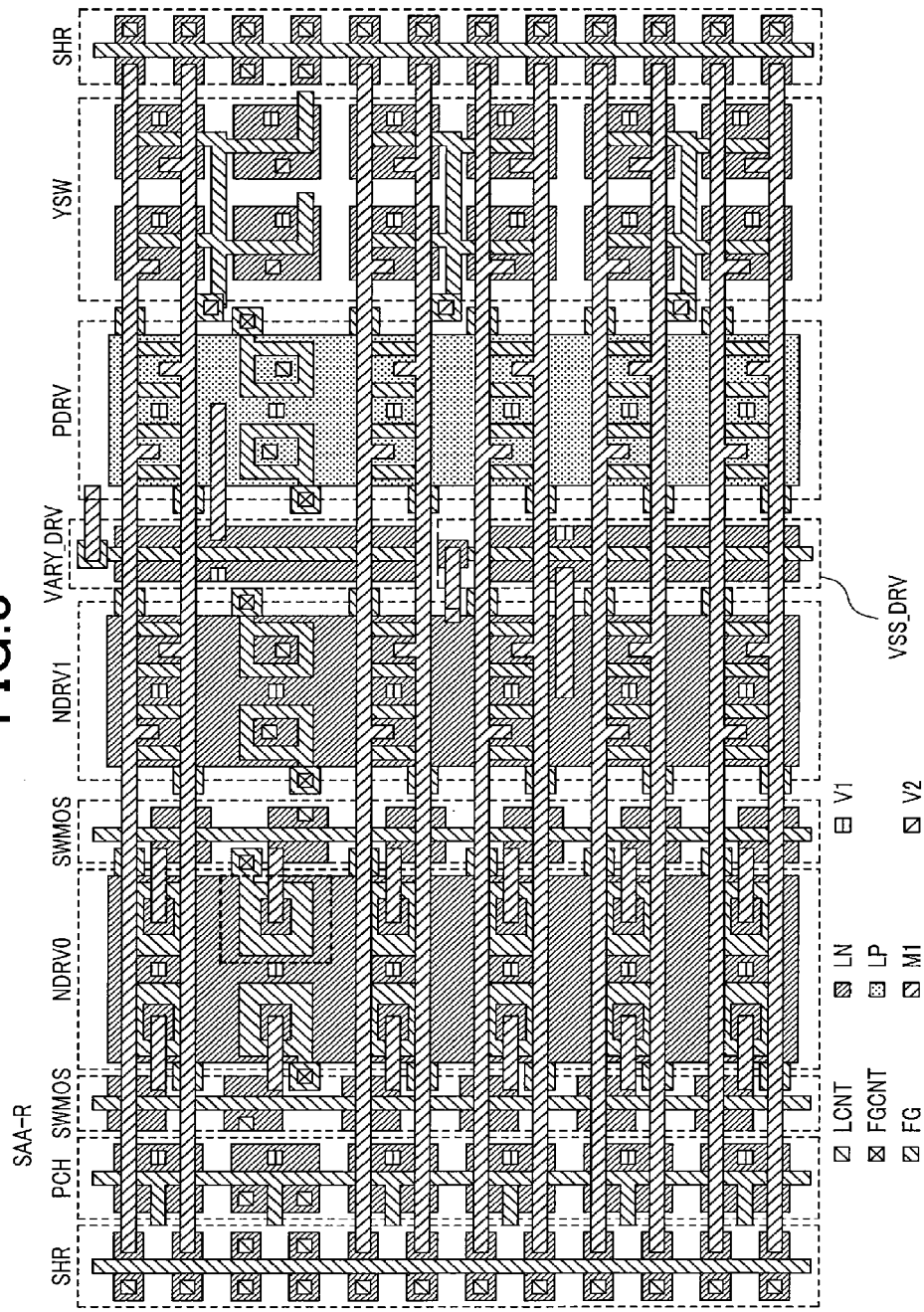
FIG. 3 is an example of a planar layout of the sense amplifier circuit in FIG. 1.

FIG. 3 and FIG. 4 show a planar layout of a sense amplifier array SAA-R constituted by using plural the sense amplifier circuits SA0 as Embodiment 1 of FIG. 1. Symbols showing the portions surrounded with broken lines partially correspond respectively to each of the circuits constituting the sense amplifier circuit SA0 of FIG. 1. In addition, SACTL represents a switching transistor control line, YS0-YS2 represents a column switch control line, and LIO0T, LIO0B, LIO1T, and LIO1B represent respectively local data lines. FIG. 4 shows an example of a wiring layout for contact V2 and a wiring layer M2 at the second layer. Further, meanings for the symbols in FIG. 3 and FIG. 4 are gate contact FGCNT for connecting the gate electrode and the wiring layer M1 (data line) at the first layer, diffusion layers LN, LP, gate electrode FG, diffusion layer contact LCNT for connecting the diffusion layers LN, LP and the wiring layer M1, and contact V2 for connecting the wiring layer M2 at the second layer and the wiring layer M3 at the third layer. Further, in FIG. 3, common source drivers VSS_DRV, VARY_DRV are used for driving the common source lines CSN and CSP, and they show an example of a layout of a so-called sense amplifier driver distributed system disposed each by one to plurality of sense amplifier circuits SA0-SA7 (not illustrated).

In FIG. 3, to one sub array SARY0, are distributed plural pull-down circuits NDRV0, switching transistors SWMOS for controlling electrical connection of the pull-down circuits NDRV0 and data lines, and circuits VARY_DRV and VSS_DRV for driving plural common source lines between the plural pull-down circuits NDVRV1 and the plural pull-up circuits PDRV operating as pairs. The switching transistor control lines SACTL for controlling the switching transistors SWMOS and control switches φCSN and φCSP for controlling the driving circuits VARY_DRV and VSS_DRV are extended in the same direction as a power source line for supplying the precharge voltage VDLR, local data lines LIO0T, LIO0B, LIO1T, LIO1B, common source lines CSN and CSP, and a power source line for supplying data line voltage VARY and ground voltage VSS, VSSA, and are formed in an identical wiring layer. Further, the wirings are formed in the direction identical with the word line. Column switch driving lines YS0-YS2 are connected by way of the contact V2 to the column switch YSW, formed to the wiring layer M3 at the third layer above the wiring layer M2 at the second layer, and extended in the identical direction with the data line.

The switching transistor SWMOS in the sense amplifier circuit SA0 is connected with the switching transistor SWMOS of the adjacent sense amplifier circuit by way of the gate electrode FG. The gate electrode FG of the switching transistor SWMOS is connected with the wiring layer M2 in a region where the sub-word driver SWD and the sense amplifier array SAA intersect to each other. With such a constitution, the wiring resistance for the entire switching transistor control line SACTL can be decreased to activate the switching transistor SWMOS at a high speed.

As described above, in the sense amplifier array SAA-R corresponding to the sub-array SARY0, by distributing the driving circuits VSS_DRV, VARY_DRV, the common source lines CSN and CSP can be driven at a high speed and, by disposing the same between the pull-down circuit NDRV1 and pull-up circuit PDRV, layout can be conducted efficiently. A portion of the wiring layer is omitted for avoiding the complexity of the drawings.

Further, as shown in FIG. 3 and FIG. 4, the addition circuit of the sense amplifier circuit SA0 practiced in FIG. 1 is only the pull-down circuit NDRV0 and the switching transistor SWMOS. Accordingly, as can be seen from FIG. 3, the area of the sense amplifier circuit SA0 also less increases. Further, since it is also excellent in the symmetry of the layout, it has an advantage that the data line noise is small. Further, since the same layout as the existent pull-down circuit NDRV1 is possible and the additional wiring along with the addition of the circuit is merely the switching transistor control line SACTL and the common source line VSSA, the layout for the sense amplifier circuit of this embodiment is easy. Further, the gate electrode of the transistor in the pull-down circuits NDRV0 and NDRV1, and the pull-up circuit PDRV is formed as a ring shape. The ring-shape gate is shown by a region surrounded with fat broken lines in the upper right part of FIG. 3. By forming the gate electrode into the ring shape, manufacturing error of the gate electrode is decreased and, accordingly, the offset of the sense amplifier circuit can be decreased more.

In FIG. 3, while the shape of the gate electrode FG for the pull-down circuits NDRV0 and NDRV1, and the pull-up circuit PDRV is shown as a ring shape, the invention is not restricted thereto. Various modifications such as a U-shape or rectangular gate electrode FG are possible. Further, by applying a method, for example, of narrowing the channel width of the common source driver VSS_DRV than that of the channel width shown in FIG. 3, or retarding the setting time for the common source control switch φCSN, the sense amplifier circuit SA0 may be operated while lowering the driving speed of the common source line CSN shown in FIG. 2. That is, after driving the pull-down circuit NDRV0, the pull-down circuit NDRV1 is driven at a relatively low speed, and, finally, the pull-up amplifier circuit PDRV is driven. This provides an advantage capable of selectively amplifying the data line DLT0 correctly to the VSS side in the pull-down circuit NDRV1 also in a case where the offset of the pull-down circuit NDRV0 increases. As described above, various modifications are possible within a range not departing the gist of the invention.

FIGS. 5A to 5D are a view showing a planar layout for the sub-array SARY in FIG. 1 and a sense amplifier arrays SAA-R and SAA-L connected therewith. Access transistor TN includes a sub-word line WL and a diffusion layer ACT, and a cell capacitor CS includes a storage node SN and a plate electrode PLT. Other symbols include cell contact SNCNT for connecting the diffusion layer ACT with the wirings or contacts thereabove, bit line contact BLCNT for connecting bit lines BLT and BLB with the diffusion layer ACT, and landing pad LPAD. The landing pad LPAD is a contact for connecting the storage node SN and the storage node contact SNCNT and, since the position for the cell capacitor CS can be optimized, the surface area of the cell capacitor CS can be increased. In a case where a sufficient capacitance is ensured for the cell capacitor CS, the landing pad LPAD may not be utilized. In this case, since the process step can be saved, the cost can be decreased.

Figure 5A:
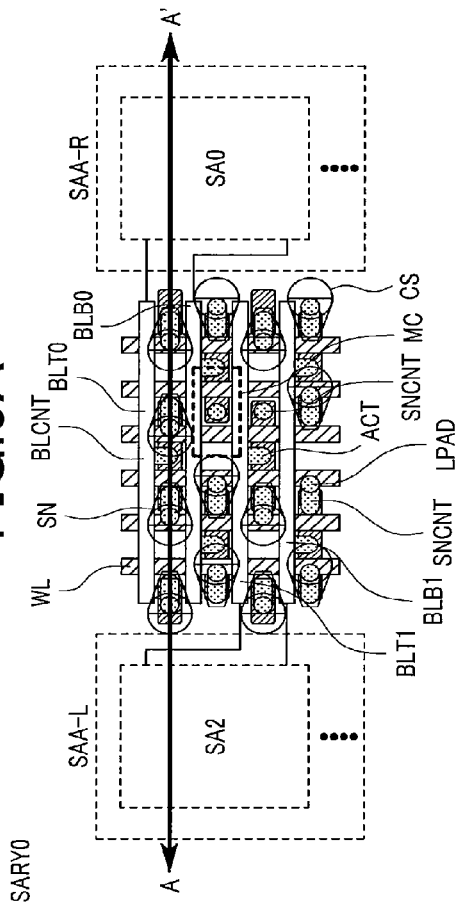
FIGS. 5A to 5D are an example of a planar layout for the memory cell array of the embodiment in FIG. 1.
Figure 5D:
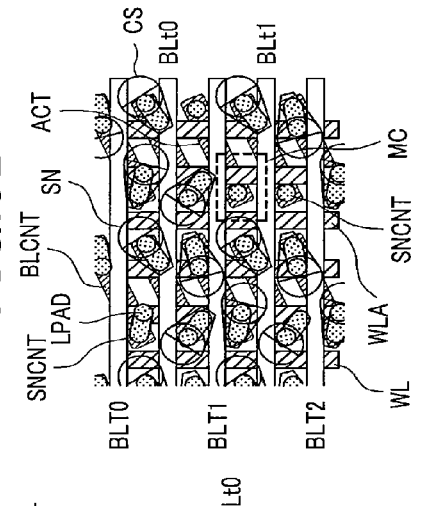
Figure 5C:
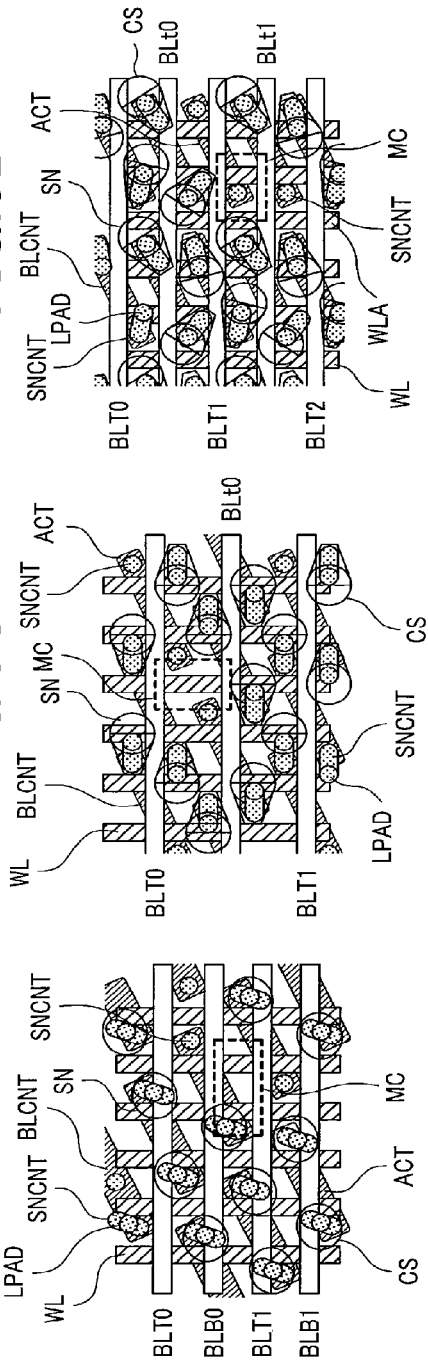
Figure 5B:
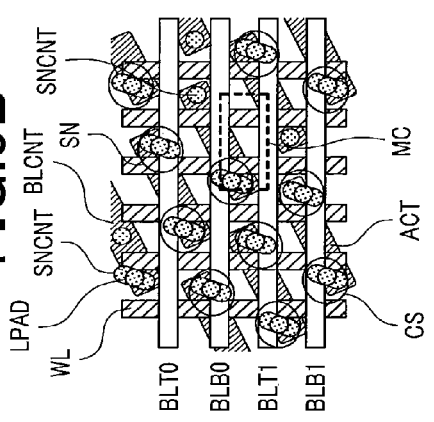

Further, various modifications are possible for the layout of the memory cell MC. FIG. 5A is a so-called folded data line structure. Since the diffusion layer ACT is in a simple rectangular shape, it has an advantage that the scaling down is easy. FIG. 5B is a quasi-folded data line structure. This is different from the structure 5A in that the diffusion layer ACT is laid out obliquely to the sub-word line WL. Since this allows a larger channel width effectively, it has an advantage capable of increasing the on-current of the access transistor TN. Accordingly, a semiconductor memory device capable of higher speed operation can be attained by combination with the memory cell structure of this embodiment. FIGS. 5C, 5D are open data line structure. It has an advantage capable of decreasing the cell area compared with the folded data line structure. In FIG. 5C, since the data line pitch is wide, the data line parasitic capacitance can also be decreased. Accordingly, by combination with the memory cell structure of this embodiment, a semiconductor memory device of a higher integration degree and capable of low voltage operation can be attained. FIG. 5D can further decrease the cell area compared with the structure C and a semiconductor memory device of higher integration degree can be attained by combination with the memory cell of this embodiment.

Naturally, the layout applicable to the memory cell structure of this embodiment is not restricted thereto. For example, in the open type data line structure in FIG. 5D, the diffusion layer ACT laid out obliquely to the sub-word line WL may be laid out such that the diffusion layer ACT may be in perpendicular as in the structure in FIG. 5A. In this case, since the shape is rectangular, it has an advantage that the scaling down is easy. Further, it is possible for the application, for example, device isolation by using the diffusion layer ACT in the adjacent cells on the right and left in common and always applying a low level VSS to the sub-word line WLA. In this case, since it is not necessary to form a device isolation region including an insulator in the direction parallel with the data line, the process step can be saved and the cost can be decreased.

As described above, various modifications are possible for the memory cell structure of this embodiment within a range not departing the gist thereof.

Figure 6:
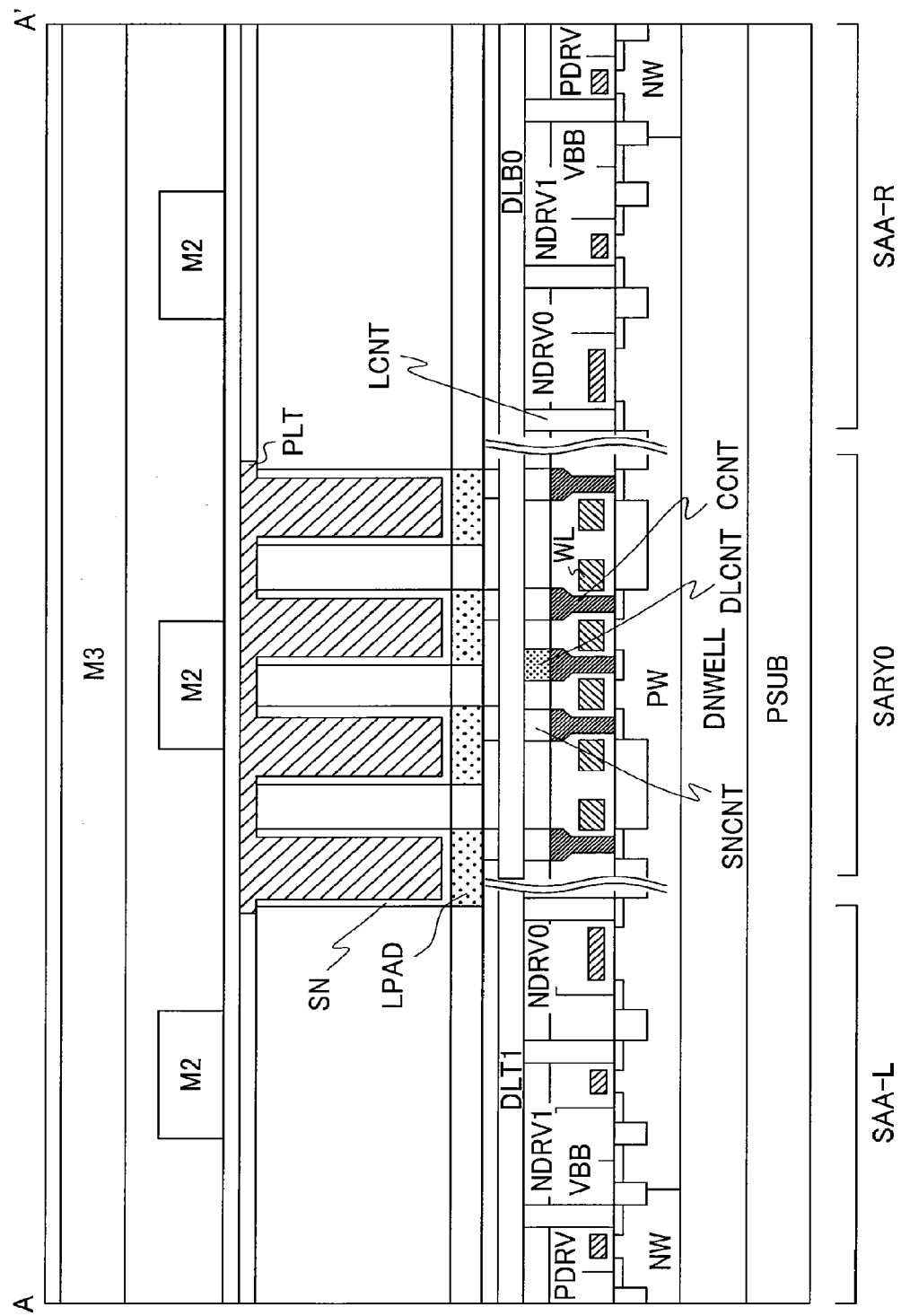
FIG. 6 is a cross sectional view for elements of the sense amplifier circuit and the memory cell array in FIG. 1.

FIG. 6 is a view showing a portion of a cross sectional view for plural memory cells MC and sense amplifier circuits SA0. References in the drawing show wiring layer M2 at the second layer, wiring layer M3 at the third layer, P-well substrate PW, N-well substrate NW, deep N-well substrate DNWELL, and P-substrate PSUB. Since the method of forming them is identical with that for a usual semiconductor memory device and, particularly, a so-called general-purpose DRAM, detailed descriptions are omitted. Further, the structure of the cell capacitor CS is not restricted to the structure shown in the drawing. Various modifications are possible including, for example, a crown type capacitor. As described above, the sense amplifier circuit SA0 of this embodiment can be attained easily since merely four NMOS transistors and wirings for common source line VSSA may be added. The diffusion layer for the NMOS transistor of the pull-down circuit NDRV0 can be constituted in the same P-type well PW as the diffusion layer for the transistor in the memory cell and the NMOS transistor of the pull-down circuit NDRV1. Further, since it is not necessary to dispose additional wirings above the sub-array SARY0, wiring noise are not generated. Accordingly, this exerts no undesired effect on the memory operation.

Figure 7:
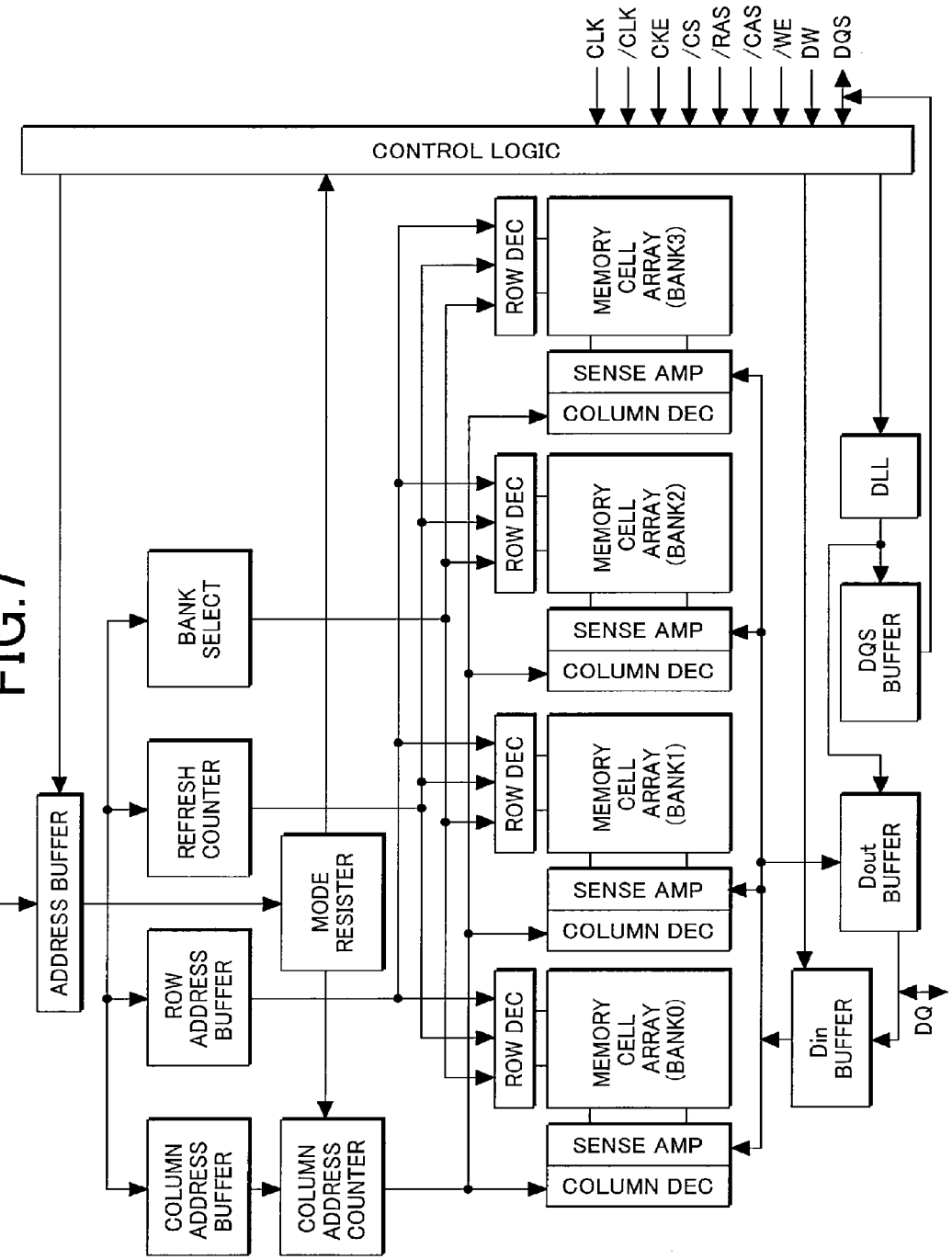
FIG. 7 is an example of a block diagram of a DRAM constituted by applying a sense amplifying circuit of the invention.

FIG. 7 shows a block diagram upon designing a DRAM chip by using a memory cell formed by the manufacturing flow of this embodiment. References shown in the drawing are address buffer ADDRESS BUFFER, column address buffer COLUMN ADDRESS BUFFER, column address counter COLUMN ADDRESS COUNTER, row address buffer ROW ADDRESS BUFFER, refresh counter REFRESH COUNTER, bank select BANK SELECT, mode resister MODE RESISTER, row decoder ROW DEC, column decoder COLUMN DEC, main sense amplifier SENCE AMP, memory cell array MEMORY CELL ARRAY, data input buffer Din BUFFER, data output buffer Dout BUFFER, data buffer DQS BUFFER, delay locked loop DLL, control logic CONTROL LOGIC, clocks CLK, /CLK, clock enable signal CKE, chip select signal/CS, row address strobe signal/RAS, column address strobe signal/CAS, write enable signal/WE, data write signal DW, data strobe signal DQS, and data DQ. Since the circuits and the signal control methods are identical with known SDRAM/DDR and SDRAM, explanations are omitted. By applying the sense amplifier circuit of this embodiment, DRAM having characteristics such as low consumption power, high speed operation, and high reliability can be attained. Further, the constitution of the block is not restricted particularly to FIG. 7. The number of the memory cell array MEMORY CELL ARRAY may be increased and various modifications are possible within the range not departing the gist of example.

Embodiment 2

While Embodiment 1 has been described for a case where the driving circuit of the common source CSP line includes one common source drier VARY_DRV, the common source driver may be provided plurally.

Figure 8:
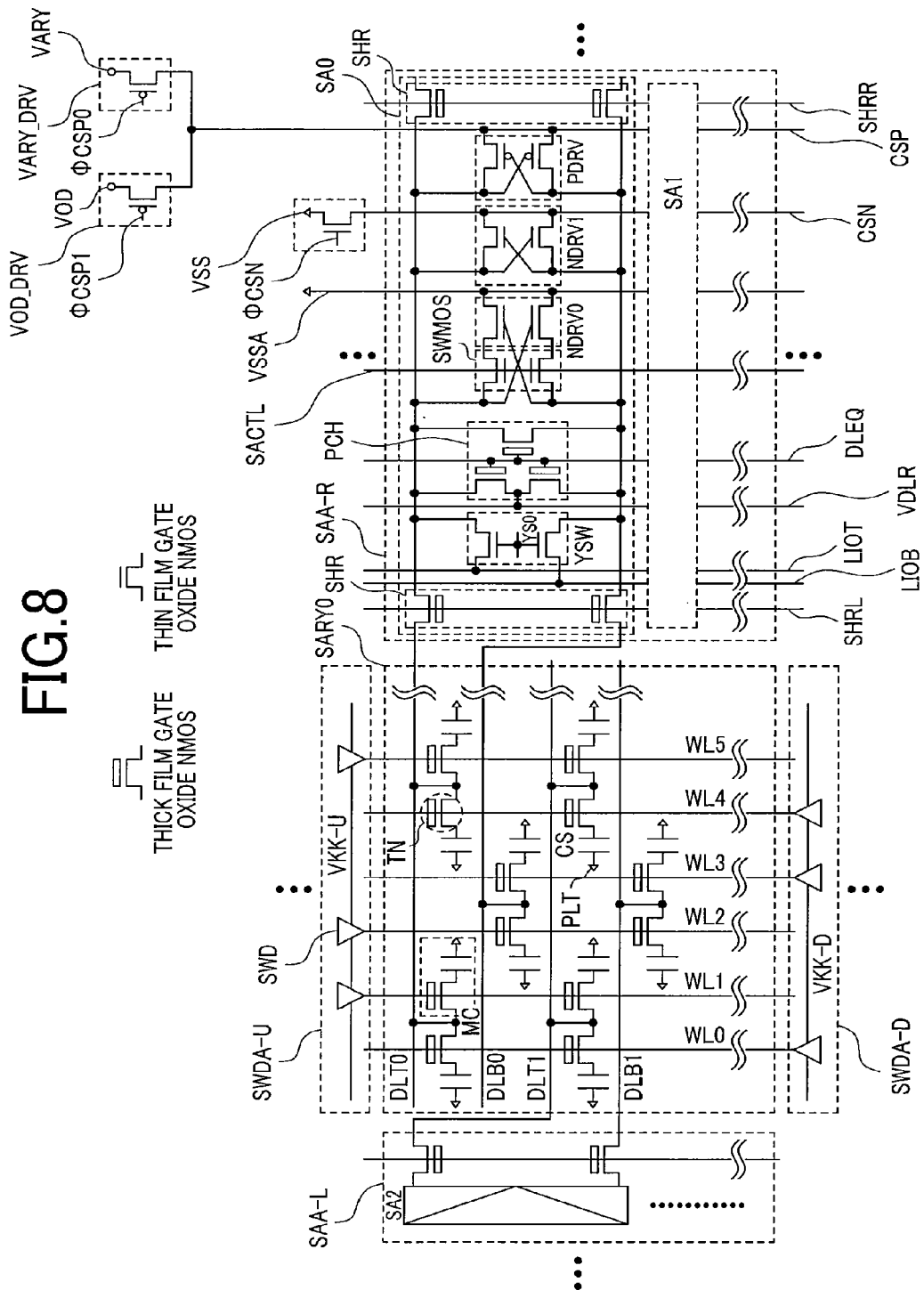
FIG. 8 shows a second embodiment using a sense amplifier circuit and an over drive system together of the invention.

FIG. 8 shows a case in which the driving circuit for the common source line CSP has common source drivers VOD_DRV and VARY_DRV in the sense amplifier circuit SA0 of this embodiment. This is different from FIG. 1 in that a common source driver VOD_DRV is added and the source voltage VOD of the common source driver VOD_DRV is higher than the source voltage VARY of the common source driver VARY_DRV. Since the meanings for the references in the drawings other than the references concerning the common source driver VOD_DRV are identical with those for FIG. 1, descriptions therefore are omitted. Further, in the sense amplifier circuit SA0, the circuit structure is identical with that in FIG. 1 and it is apparent that the same effect as that explained for FIG. 1 can be obtained.

Figure 9:
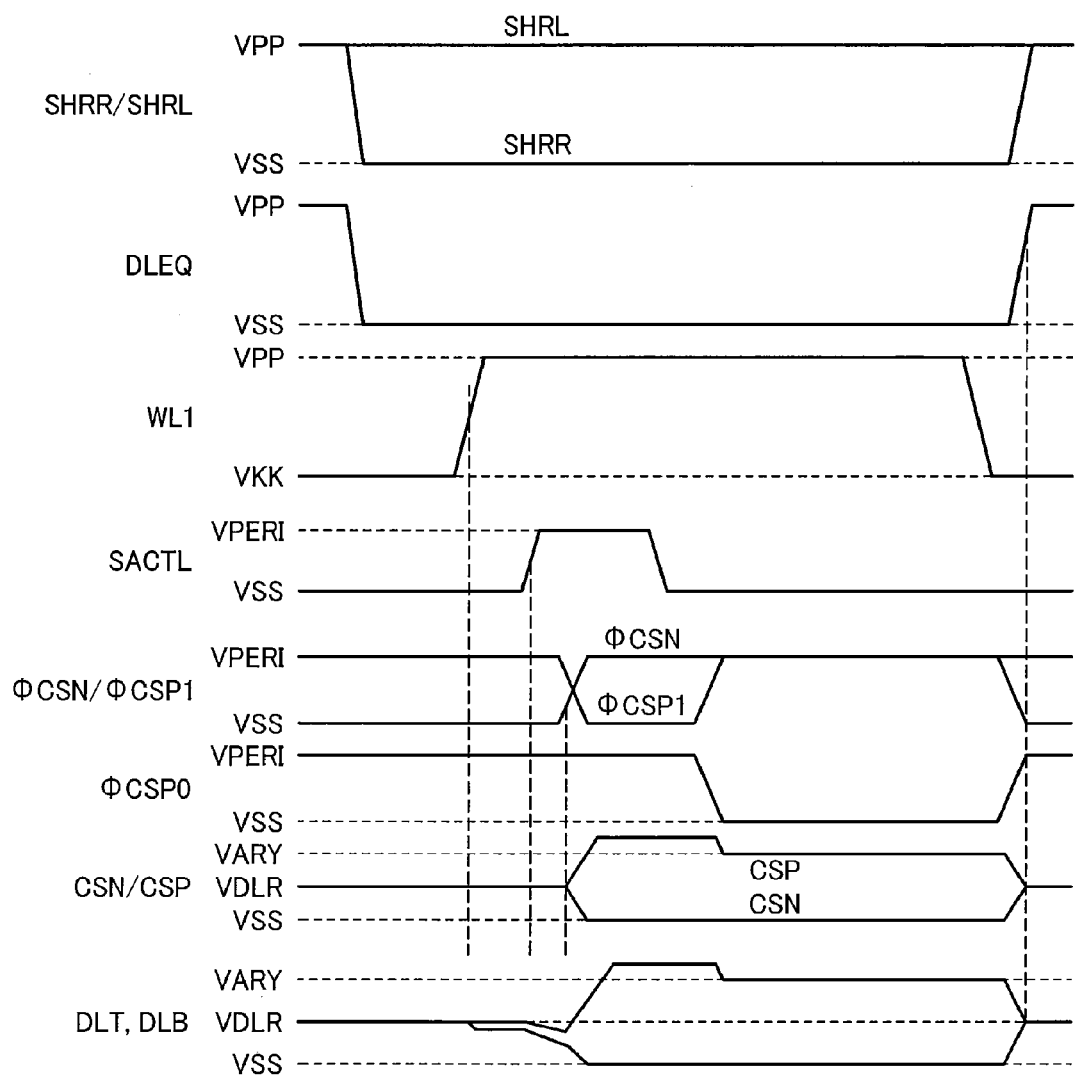
FIG. 9 is an example of an operation waveform of the sense amplifier circuit in FIG. 8.

FIG. 9 is an example of an operation waveform for the embodiment shown in FIG. 8. This is different from the operation waveform in FIG. 2 in that the amount of read signal is amplified by the pull-down circuit NDRV0 to higher than the offset voltage for the pull-down circuit NDRV1 and the pull-up circuit PVRV, and the common source control switch φCSN and φCSP1 are asserted substantially simultaneously, and then negation for the common source control switch φCSP1 and assertion for the common source control switch φCSP0 are conducted simultaneously. Further, it is also different in that the source voltage for the added common source driver VOD_DRV is a VOD voltage higher than the high level voltage VARY of the data line. As a result, at the initial stage of sensing, the voltage on the common source line CSP is increased as far as the VOD level which is a voltage higher than the data line high level voltage VARY. Further, since the voltage on the data lines DLT, DLB is also increased to higher than the data line high level voltage VARY, the consumption current sometimes increases due to the over charging of the data line. In view of the above, after amplifying the data line just to the necessary level, the common source control switch φCSP1 is negated, and the common source control switch φCSP0 is asserted substantially at the same time. By control as described above, the high level voltage on the data line can be set to VARY as a desired voltage. Further, increase of the consumption current due to over charging of the data line can be prevented.

The advantages obtained by the control as shown in FIG. 9 are as described below. By setting the source voltage of the added common source driver VOD_DRV to a voltage higher than VARY as the VOD level, the source voltage of the pull-up circuit PDRV can be increased. Since the driving current for the PMOS cross couple transistors can be increased by making the source level of the pull-up circuit PVRV higher, it is possible to increase the speed of latching the data line to the ground level and to the data line high level voltage VARY. Further, since a driving current for the pull-up circuit PDRV can be ensured sufficiently even in a case where the voltage of the data line voltage VARY is lowered to decrease the amount of the read signal, stable latch operation is possible. That is, since the sensing operation at low voltage can be attained, this provides an advantage capable of decreasing the consumption current of the chip.

Further, although it has not been described particularly, negation for the switching transistor control switch SACTL and negation for the common source control switch φCSP1 are preferably conducted at a substantially identical timing. In a case where the negation timing is identical, it provides an advantage capable of decreasing the number of circuits for the timing control circuit.

Embodiment 3

Embodiment 1 and Embodiment 2 show a PMOS transistor constituting the common source drivers VOD_DRV, VARY_DRV in a case of a thin film PMOS transistor in which the gate insulative film is thin (about 3 nm), but a thick film NMOS transistor with a thick gate insulative film (about 6 nm) may also be applied instead of the PMOS transistor constituting the common source drivers VOD_DRV, VARY_DRV described above.

Figure 10:
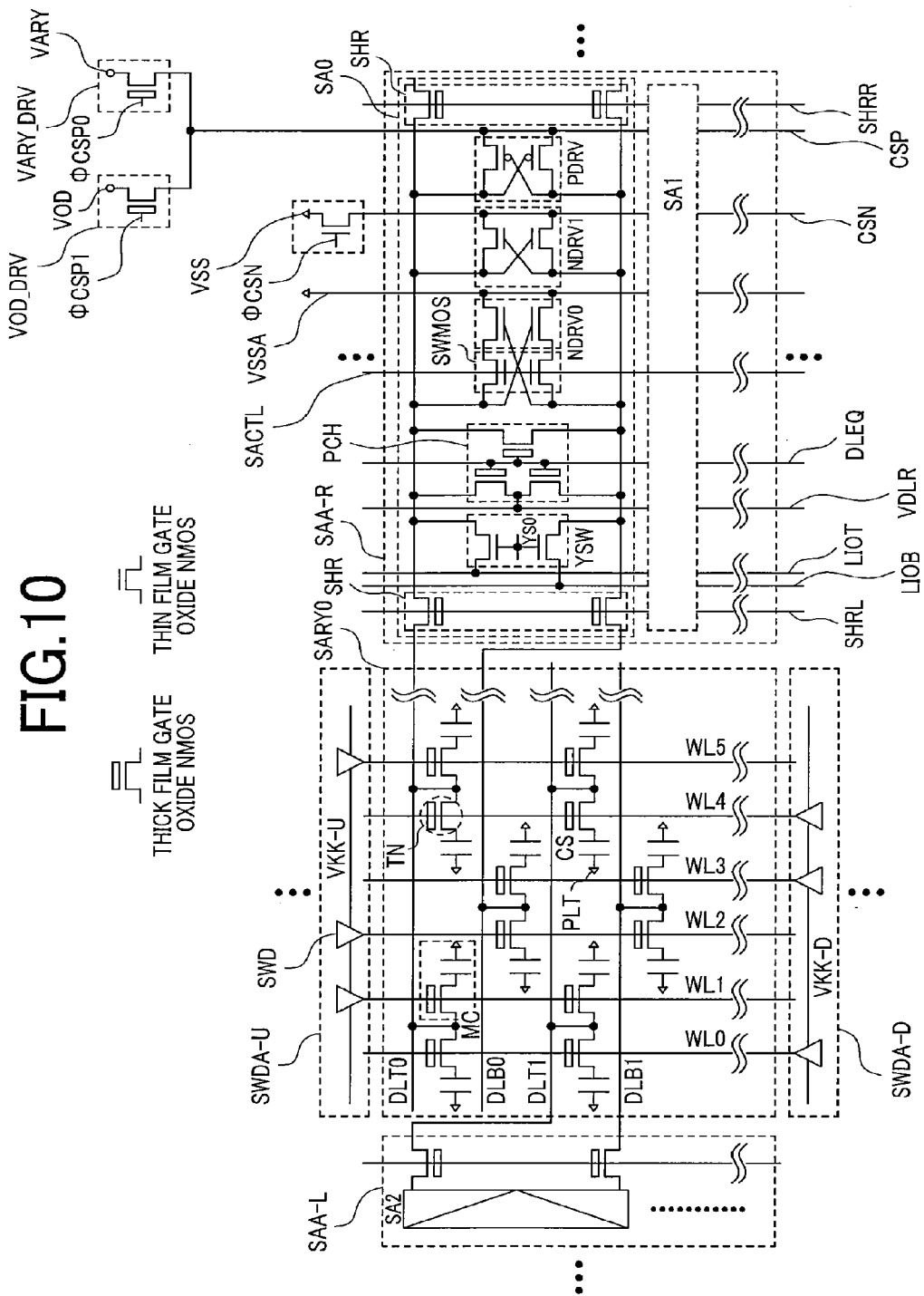
FIG. 10 shows a third embodiment of applying a thick film element as a common source driver when using a sense amplifier circuit and an over drive system of the invention in combination.

FIG. 10 shows a case of applying a thick film NMOS transistor to common source drivers VOD_DRV and VARY_DRV in the sense amplifier circuit SA0 of the invention. It is different from FIG. 8 in that the transistor constituting the common source drivers VOD_DRV and VARY_DRV is a thick film NMOS transistor. Further, it is also different in that the gate voltage level that asserts the common source control switches φCSP0 and φCSP1 is at the raised voltage VPP since the transistor is the thick film NMOS transistor. The operation waveform chart is different from FIG. 9 only in that the common source control switch φCSP1 is asserted from the ground voltage VSS to the raised voltage VPP and that the common source control switch φCSP0 is asserted from the ground voltage VSS to the raised voltage VPP upon sensing. Description with reference to the chart is omitted.

Further, the invention is not restricted to the embodiment described above. For example, the transistor constituting the common source driver VOD_DRV may also be a thick film NMOS transistor and the transistor constituting the common source driver VARY_DRV may be a thin film PMOS transistor. When the thin film PMOS transistor is used for the common source driver VARY_DRV, the gate voltage can be lowered to a voltage identical with the external supply voltage VDD. That is, since the charge/discharge current for the common source control switch φCSP0 can be decreased, the chip consumption power can be decreased. Further, it is also possible to utilize a thin film PMOS of a low threshold voltage specification of lowering the threshold voltage of the thin film PMOS transistor constituting the common source driver VARY_DRV. In this case, since the driving current for the common source driver VARY_DRV increases, the speed of the rewriting operation of the H level voltage VARY to the memory cell can be increased. Further, a thick film NMOS transistor may also be applied to the common source driver VARY_DRV in the embodiment of FIG. 1. Further, a thick film NMOS transistor may also be applied to the common source driver VSS_DRV. As described above, various modifications of the circuits are possible within the range not departing the gist of the invention.

Embodiment 4

Embodiment 1 to Embodiment 3 show the constitutions that decrease the off leakage current of the sense amplifier SA0 but decrease of the off leakage upon data latch is not sometimes a top priority matter depending on the applications. In such a case, the sense amplifier circuit SA0 may also be constituted by using the circuit constitution shown below.

Embodiment 1 to Embodiment 3 show the circuit constitutions capable of decreasing the subthreshold leakage current flowing from the sense amplifier circuit SA0 by utilizing the switching transistor SWMOS but the sense amplifier SA0 may also be constituted by adding only the pull-down circuit NDRV0 not utilizing the switching transistor SWMOS. In this case, it is desirable that the threshold voltage of the added pull-down circuit NDRV is an ultra-low threshold voltage SLV which is necessarily and sufficiently low.

Figure 11:
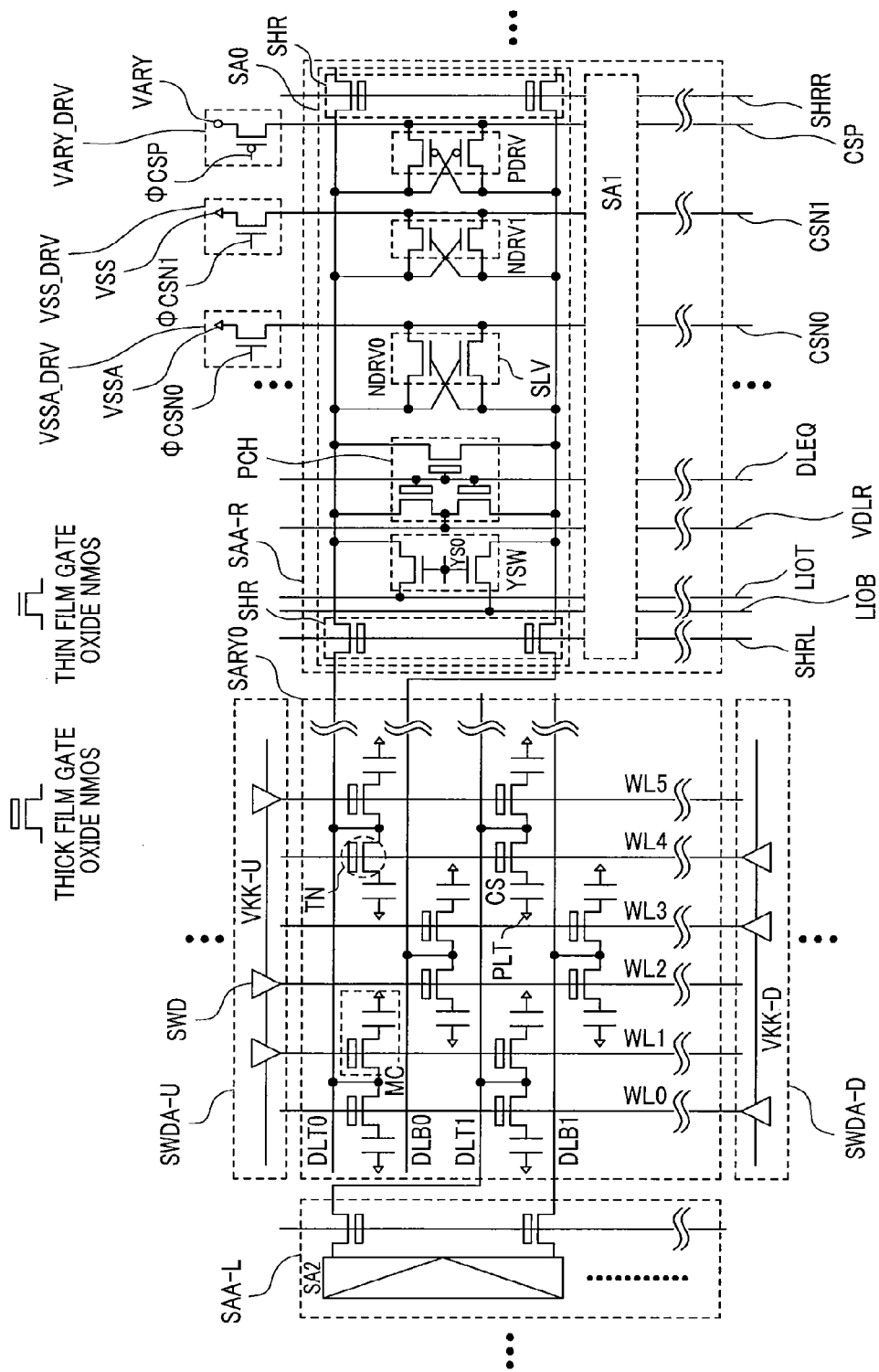
FIG. 11 shows a fourth embodiment in which a pull-down circuit NDRV0 constituted with an NMOS transistor of a super low threshold voltage specification is added to an existent sense amplifier circuit in the sense amplifier circuit of the invention.

FIG. 11 shows an example of adding a common source driver VSSA_DRV for driving the common source line CSN0 of the pull-down circuit NDRV0, to the exist sense amplifier circuit. Further, NMOS transistor constituting the pull-down circuit NDRV0 is a thin film NMOS transistor of an ultra low threshold voltage SLV specification having a sufficiently low threshold voltage. As can be seen from FIG. 11, the sense amplifier circuit of the invention has an extremely small number of addition circuits and has an advantage further capable of decreasing the chip size compared with FIG. 1 that utilizes the switching transistor SWMOS. Further, since the NMOS transistor of ultra low threshold voltage SLV is applied to the pull-down circuit NDRV0, the effective gate voltage VGS of the NMOS transistor constituting the pull-down circuit NDRV can be ensured sufficiently even in a case of lowering the voltage of the data line high level voltage VARY. Accordingly, also in a case of lowering the voltage of the data line high level voltage VARY, stable reading operation is possible. That is, since the charge/discharge current for the data line can be decreased, the chip consumption power can be decreased.

As the means for preparing the transistor of the ultra low threshold voltage specification, ions may be implanted to a Si substrate while lowering the impurity concentration for controlling the threshold voltage. Further, as other means, after ion implanting standard impurities for controlling the threshold voltage of the NMOS transistor into a Si substrate, impurities for controlling threshold voltage of the PMOS transistor are ion implanted into the Si substrate. By ion implanting impurities of different conduction types into the Si substrate, it is possible to control from the standard threshold voltage to a lower threshold voltage. In this case, since no mask is additionally provided for controlling the ultra low threshold voltage, it also provides an advantage capable of suppressing the increase of the cost.

Further, the threshold voltage may be set lower not by the threshold voltage design based on the impurity but by decreasing the thickness of the gate insulative film. It will be apparent described above that various modifications are possible for the means of preparing the transistor of the ultra low threshold voltage specification.

Figure 12:
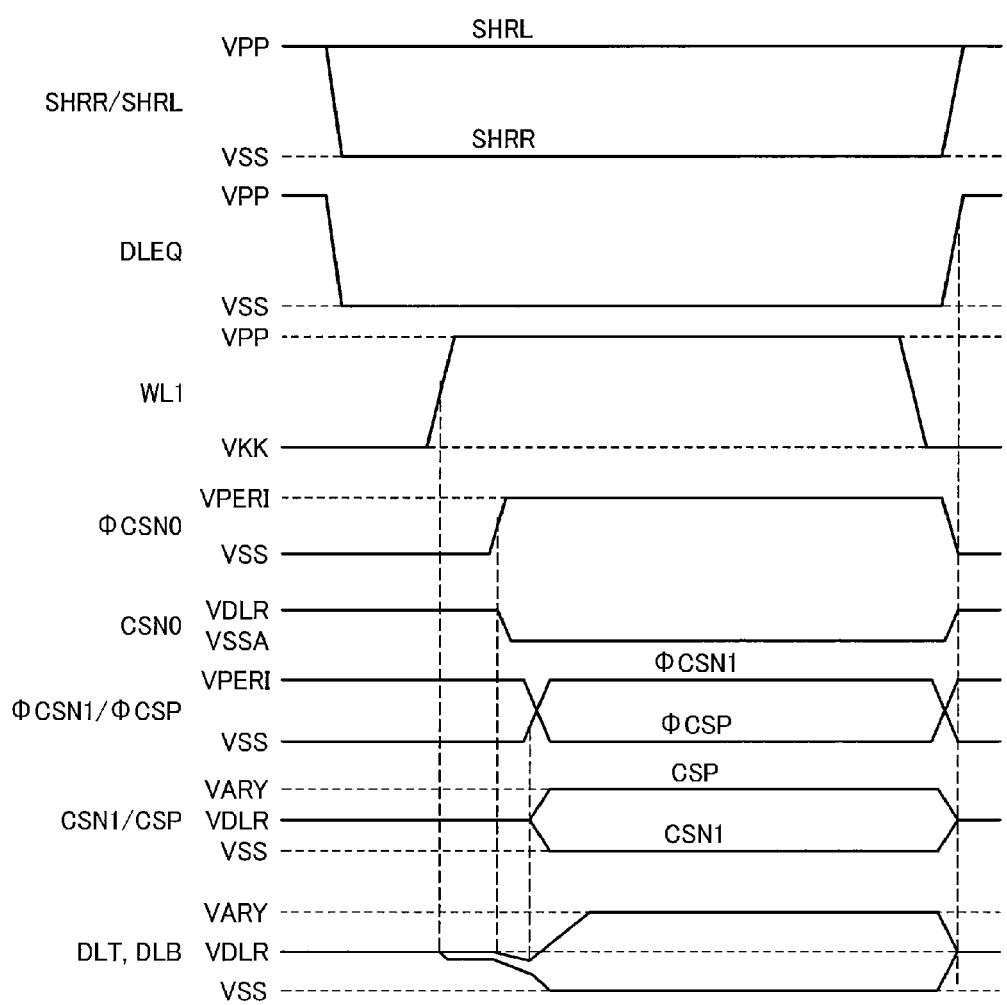
FIG. 12 is an example of an operation waveform of the sense amplifier circuit in FIG. 11.

FIG. 12 shows an operation waveform of the sense amplifier circuit SA0 shown in FIG. 11. This is different from the driving method of the sense amplifier circuit SA0 of Embodiment 1 shown in FIG. 2 in that the common source control switch φCSN0 asserted upon sensing is kept activated just before a precharge command.

After asserting the sub-word line SWL and outputting the amount of read signal to the data line pair DLT0, DLB0, the common source control switch φCSN0 is asserted to activate the pull-down circuit NDRV0. Thus, the small amount of read signal is pre-amplified to higher than the offset voltage of the pull-down circuit NDRV1 and pull-up circuit PDRV to be activated later. After the data line is amplified sufficiently by the pull-down circuit NDRV0, the common source control switches φCSN1 and φCSP are asserted to activate the pull-down circuit NDRV1 and pull-up circuit PDRV respectively. By such control, a stable reading operation can be attained to prevent wrong operation given in a case where the offset of the pull-down circuit NDRV1 and the pull-up circuit PDRV is large.

Figure 13:
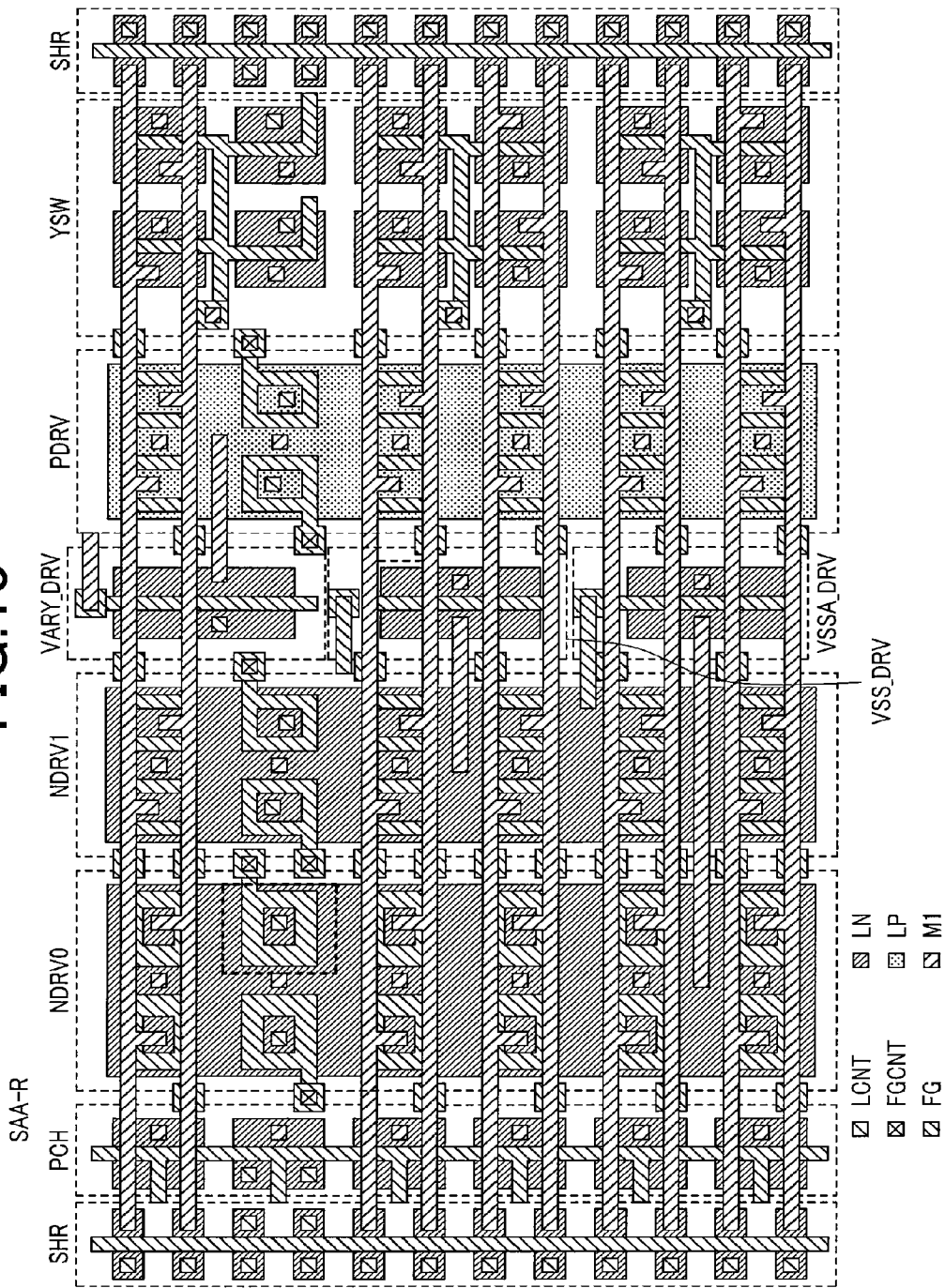
FIG. 13 is an example of a planar layout of the sense amplifier circuit in FIG. 11.

FIG. 13 is a planar layout of a sense amplifier array SAA-R constituted with plural the sense amplifier circuits SA0 shown in FIG. 11. This is different from FIG. 3 in that the switching transistor SWMOS is not present, and a common source driver VSSA_DRV for driving the pull-down circuit NDRV0 is added. As described above, since the sense amplifier circuit SA0 of this embodiment has no switching transistor SWMOS, the layout area of the sense amplifier can be minimized. That is, increase in the chip area can be minimized. Further, the additional pull-down circuit NDRV0 is controlled by activation and inactivation of the common source control switch φCSN0. Since the common source control switch φCSN0 can be used in common with plural sense amplifier circuits, a relatively large layout size can be ensured. When a large layout size can be ensured, the manufacturing error for the common source driver VSSA_DRV can be decreased and the common source line CSN0 can be driven at a level nearer to the ground level.

On the other hand, in a case where the switching transistor SWMOS is present on every sense amplifier circuit as shown in FIG. 1 and FIG. 3, since the layout size is small, the manufacturing error for the switching transistor SWMOS sometimes increases. In such a case, fluctuation of the threshold voltage due to the manufacturing error of the switching transistor SWMOS may constitute a noise source for the amount of read signal. As described above, in this embodiment, since the pull-down circuit NDRV0 is driven by the common source driver VSSA_DRV instead of the switching transistor SWMOS in this embodiment, it has an advantage capable of also suppressing the generation of the noise source as described above. Further, the gate electrode of the pull-down circuit NDRV0 is formed as a ring shape. This can decrease the manufacturing error for the gate electrode to decrease the offset of the sense amplifier circuit more. In FIG. 13, the shape of the gate electrode FG for the pull-down circuits NDRV0 and NDRV1 and the pull-up circuit PDRV is shown as a ring shape, the invention is not restricted to the same. A gate electrode of the ring shape may be applied to the pull-down circuit NDRV0 requiring sensing operation at high sensitivity and a U-shaped or rectangular gate electrode may be applied to the pull-down circuit NDRV1 and the pull-up circuit PDRV. For example, in a case of forming the rectangular gate electrode, the area of the sense amplifier layout can be made smaller than that of the ring shape gate electrode. Accordingly, this provides an advantage capable of decreasing the chip size. As described above, various modifications are possible within a range not departing the gist of the invention.

Embodiment 5

Embodiment 1 to Embodiment 4 show examples of applying a negative voltage VKK which is lower than the ground voltage VSS as the source voltage of the sub-word driver SWD. With such a constitution, the word line stand-by voltage of the memory cell transistor TN can be set to the negative voltage VKK. Since the gate voltage on the memory cell is negative, the threshold voltage increases effectively during a stand-by state. Accordingly, the threshold voltage of the memory cell transistor TN may not be set higher than necessary by ion implantation of impurities. As a result, in a case of applying a raised voltage VPP to the gate electrode of the memory cell upon selection of the word line, the effective gate voltage on the memory cell transistor TN increases and the on current of the memory cell increases. When the on current increases, the time till the amount of read signal is outputted from the memory cell to the data line or the writing speed of the high level voltage VARY to the memory cell can be increased. Further, since there is no requirement for ion implanting impurities for the threshold voltage control by more than a necessary amount, an electric field at the so-called PN junction portion or between the gate and the diffusion layer in the diffusion layer of the memory cell transistor TN can be moderated. When the electric field after the PN junction portion or between the gate and the diffusion layer is moderated, a so-called junction leakage generated there or GIDL current (GIDL: Gate Induced Drain Leakage Current) can be decreased. That is, it provides an advantage capable of extending the retention time of DRAM and capable of decreasing the stand-by power consumption. However, in an application use where the preference is given to the high speed operation of the chip larger than to the decrease of the stand-by power consumption of the chip, the sense amplifier SA0 may also be constituted by using the following embodiment.

Figure 14:
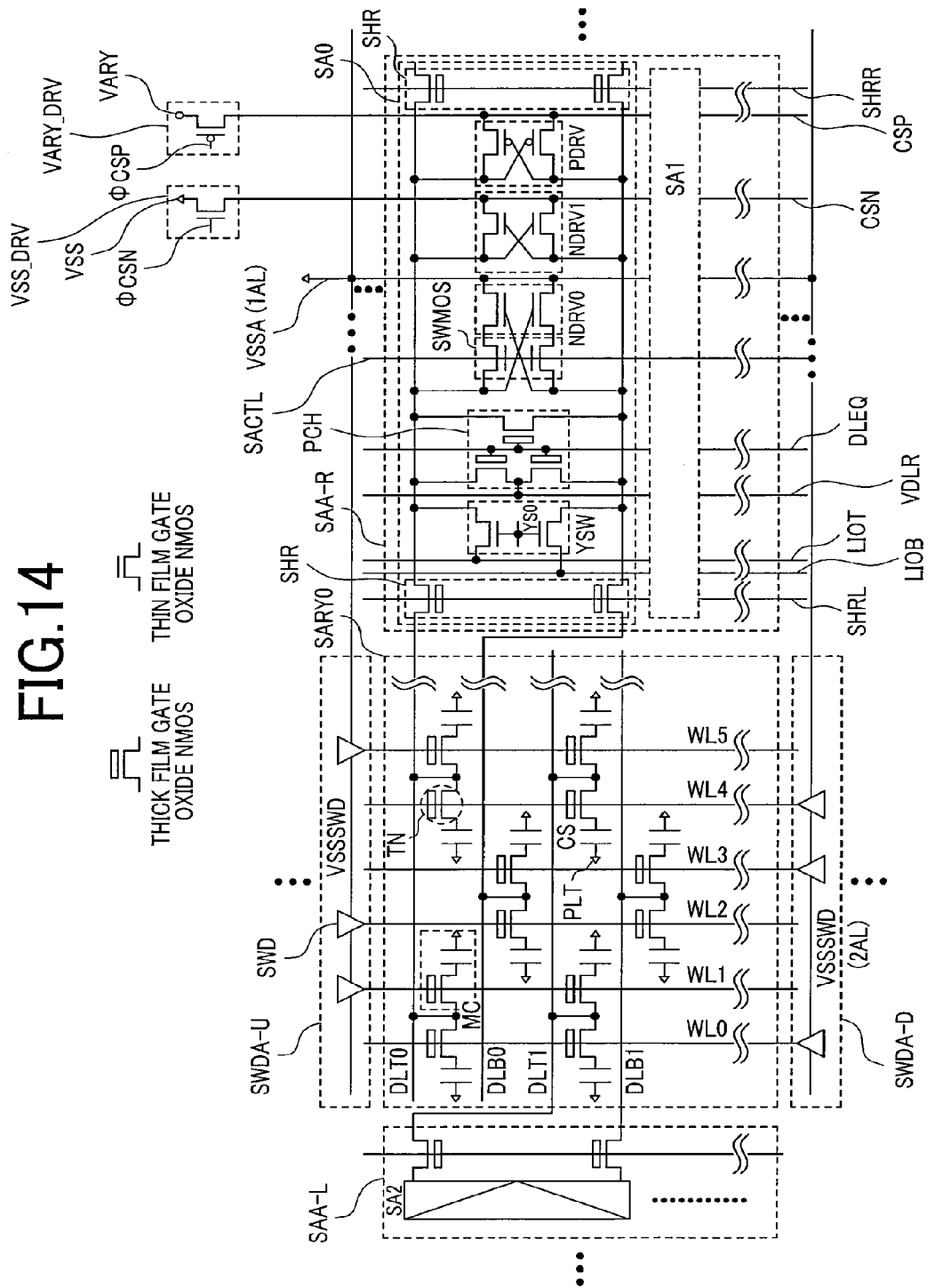
FIG. 14 shows a fifth embodiment in which a source potential of a sub-word driver and a source potential of a pull-down circuit NDRV0 are electrically connected by a metal wiring in the sense amplifier circuit of the invention.

FIG. 14 shows an example of applying the ground level VSS to the source potential VSSSWD of the sub-word driver SWD and electrically connecting the same with a common source line VSSA of the pull-down circuit NDRV0. In FIG. 1, since the negative voltage VKK is applied to the source potential of the sub-word driver SWD, it can not be electrically connected with the common source line VSSA (ground potential: VSS) of the pull-down circuit NDRV0. This is the difference between FIG. 1 and FIG. 14. Since the driving method is identical with FIG. 1 for the portions where the symbols or circuit constitutions are identical, detailed descriptions with reference to the operation waveforms are omitted.

Figure 15:
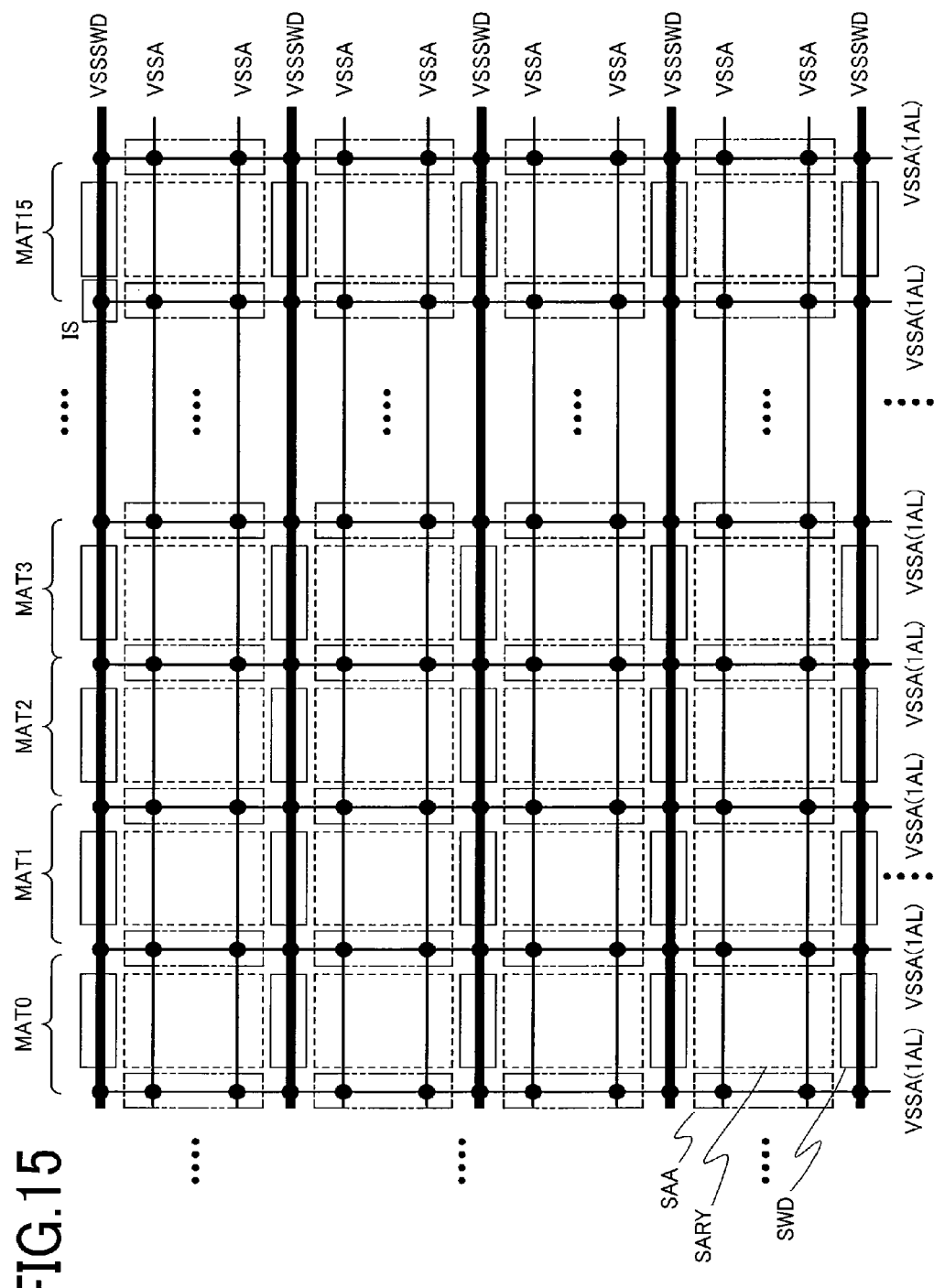
FIG. 15 is an example showing the constitution of power source wirings in the sense amplifier circuit of FIG. 14.

FIG. 15 is a view showing an example of a power source wiring constitution in the bank BANK using the sense amplifier circuit SA0 shown in FIG. 14. For the simplicity of explanation, circuit blocks such as row decoder ROW DEC, column decoder COLUMN DEC, etc. are omitted. Further, for the simplicity of the explanation, power source wirings in the bank BANK such as supply power source VDD, peripheral circuit power source VPERI, and raised voltage VPP are omitted.

The bank BANK shown in FIG. 15 includes plural sub-word drivers SWD, sense amplifier arrays SAA, sub-arrays SARY, and intersection portions IS as regions put between the sense amplifier arrays SAA and the sub-word drivers SWD. In the embodiment of FIG. 15, common source line VSSA wirings are arranged in the wiring layer M2 (for example, first layer aluminum 1AL) in the longitudinal direction of the drawing. Further, common source line VSSA wirings (for example, second layer aluminum 2AL) are arranged in the wiring layer M3 in the left to right direction of the drawing. Further, source potential VSSSWD wirings of the sub-word drivers SWD are arranged also in the wiring layer M3 (for example second layer aluminum 2AL). The common source lines VSSA arranged in the wiring layer M3 are connected with the common source lines VSSA in the wiring layer M2 on the sense amplifier arrays SAA and connected by way of the inter-wiring layer contact with the common source line VSSA of the pull-down circuit NDRV0 finally. As described above, when the power source wirings are arranged in the mesh, it provides an advantage of strengthening the common source potential and increasing the sensing speed.

In the embodiment of FIG. 15, the common source lines VSSA in the wiring layer M2 and the source potentials VSSSWD of the sub-word drivers SWD in the wiring layer M3 are electrically connected by way of the inter-wiring layer contact above the intersection portions IS. With such a constitution, the parasitic capacitance of the sub-word driver SWD serves as a smoothing capacitance for the common source line VSSA. That is, the source level of the common source line VSSA can be strengthened and the sensing speed can be made higher compared with the existent case. Further, the source potential on the sub-word driver SWD is not the negative voltage VKK but VSSSWD as the ground potential. Accordingly, while the retention time may possibly be shortened as described above, since the sensing speed can be increased, this is suitable to an application use in which importance is attached to a high speed performance. On the other hand, in the existent power source wiring constitution in the bank BANK shown in FIG. 16, the negative potential VKK is applied as the source potential to the sub-word driver SWD. Accordingly, the common source line VSSA and the source potential VKK of the sub-word driver SWD can not be connected on the intersection portion IS. Since the parasitic capacitance of the sub-word driver SWD can not be utilized as the smoothing capacitance for the common source line VSSA, the sensing speed may sometimes be lowered compared with the embodiment of FIG. 15. However, VKK as the negative voltage is applied as the source potential of the sub-word driver SWD. Accordingly, this is suitable to such an application use in which the retention time, that is, the stand-by power consumption has a preference to the high speed performance.

Further, the embodiment of FIG. 15 may also be applied to such an application in which preference is given to the stand-by power consumption. On the other hand, it is apparent that the embodiment of FIG. 16 may be applied to an application in which preference is given to the high speed performance.

Figure 16:
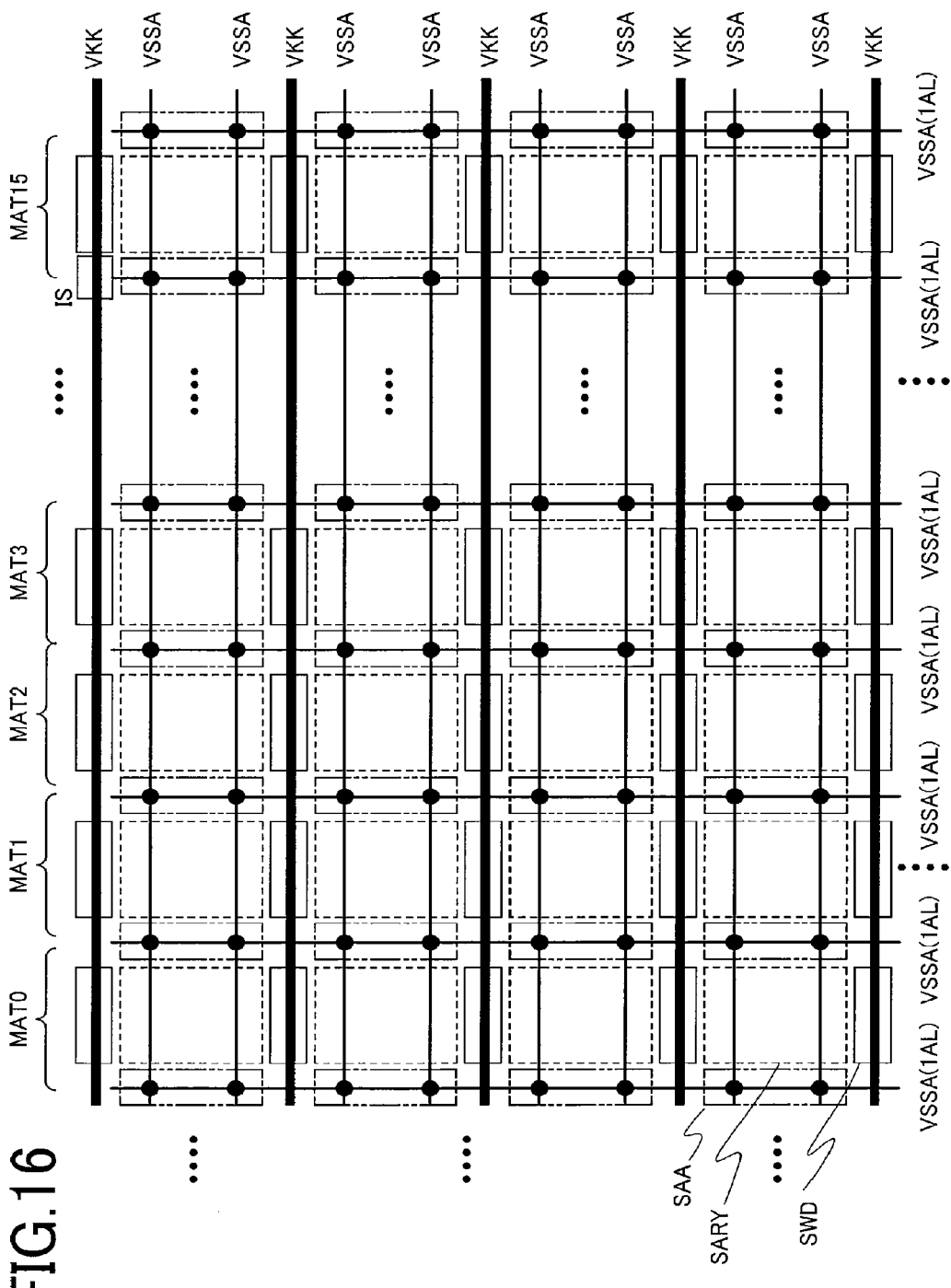
FIG. 16 is an example showing the constitution of a power source wirings in a case where the source potential of the sub-word driver and the source potential of the pull-down circuit NDRV0 are not connected by metal wirings.
Figure 17A:
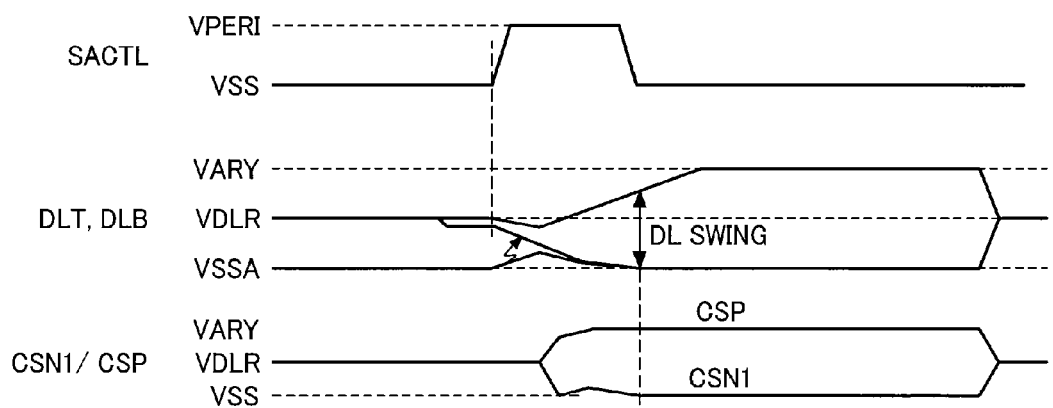
FIGS. 17A and 17B show an example of an operation waveform in a sense amplifier circuit of the power source wiring constitution in FIG. 15 and FIG. 16.
Figure 17B:
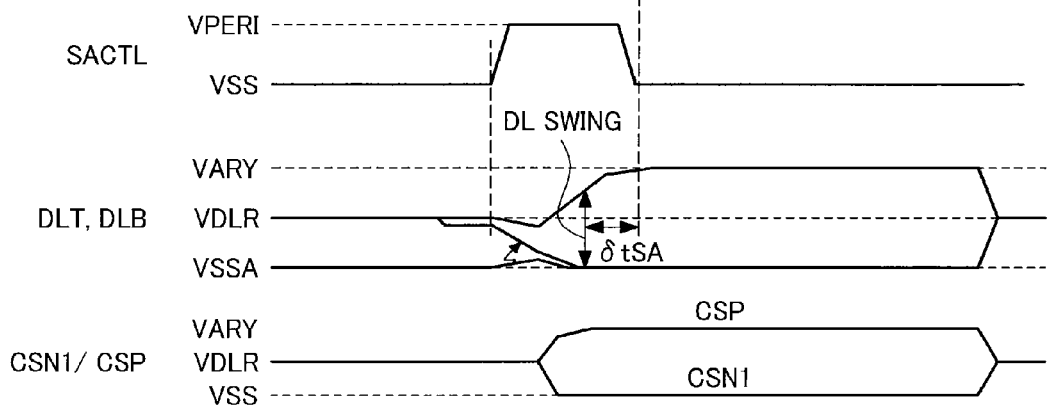

FIG. 17 shows a sensing operation waveform B upon applying the power source wiring constitution of FIG. 15 and a sensing operation waveform A upon applying the power source wiring constitution of FIG. 16. In FIG. 15, since the parasitic capacitance of the sub-word driver SWD is utilized as the smoothing capacitance for the common source line VSSA of the pull-down circuit NDRV0, floating of the common source line VSSA from the ground potential level is suppressed upon activation of the switching transistor control signal. Since the floating of the common source line VSSA is suppressed, an effective gate to source voltage VGS of the pull-down circuit NDRV0 is ensured sufficiently. As a result, a driving current for amplifying the amount of read signal can be increased. That is, the sensing speed can be increased by so much as δtSA shown in the chart.

While a description has been made with reference to FIG. 14 to FIG. 17, the invention is not restricted to the constitution described above. While the sense amplifier circuit SA0 has been explained as the sense amplifier circuit SA0 of Embodiment 1, the constitution of the power source wiring as shown in FIG. 15 may also be adopted by using the sense amplifier circuit SA0 that has been explained for Embodiment 2 to Embodiment 4. Further, the source potential VSS wiring of the pull-down circuit NDRV1 and the source potential VSSSWD of the common source line VSSA and the sub-word driver SWD may also be electrically connected on the intersection portion IS. With such a constitution, the speed of amplifying either the data line DLT or DLB to the ground potential can be further increased. As described above, various modifications are possible within a range not departing the gist of the invention.

Embodiment 6

In Embodiment 1, Embodiment 2, Embodiment 3, and Embodiment 5, while the threshold voltage of the additional pull-down circuit NDRV0 is shown for the case of constitution with the value equivalent with the threshold voltage of a usual thin film transistor used in the row decoder ROW DEC or the column decoder COLUMN DEC, an ultra low threshold voltage SLV in which the threshold voltage of the pull-down circuit NDRV0 is sufficiently lowered may also be applied.

Figure 18:
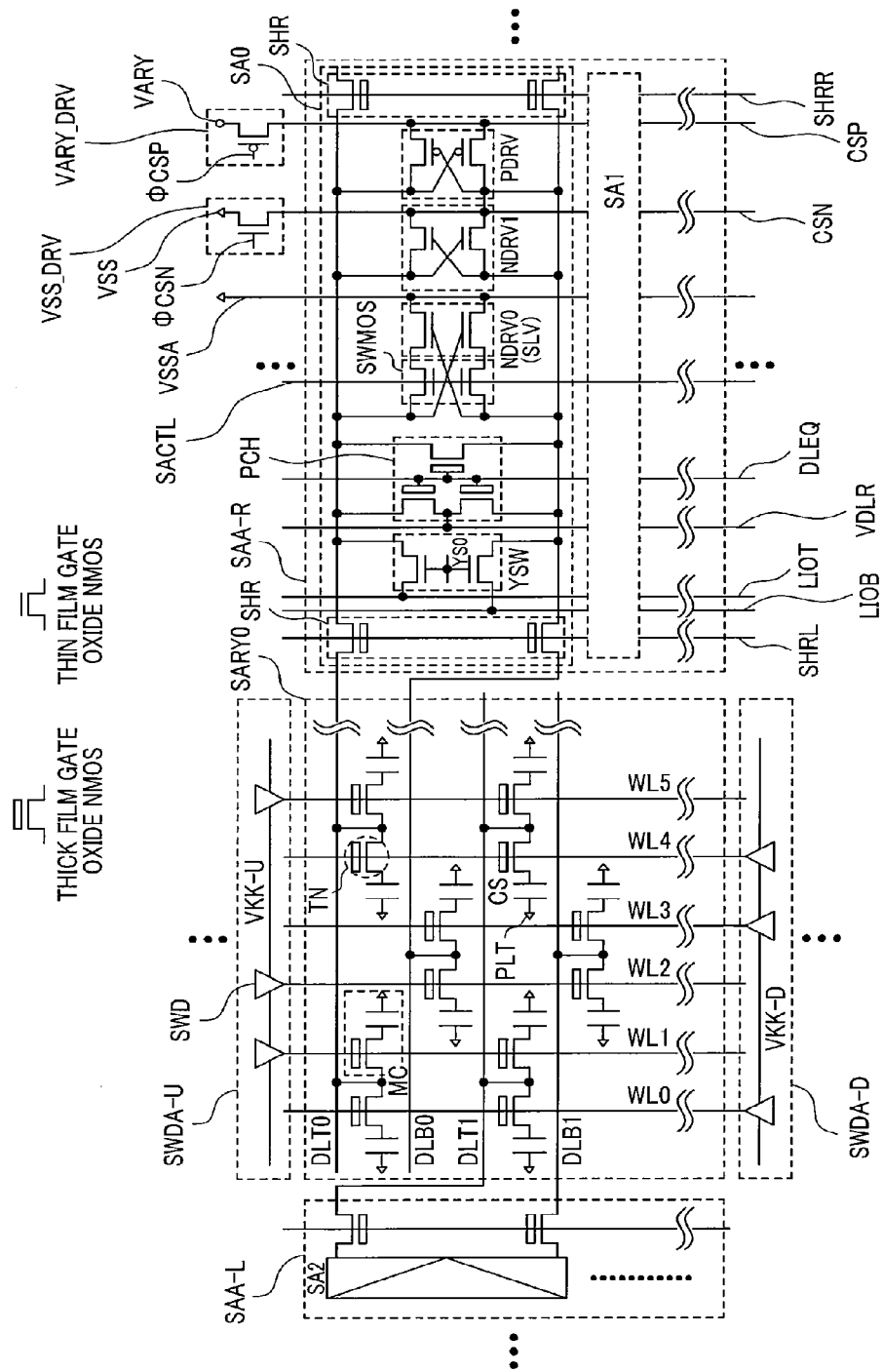
FIG. 18 shows a sixth embodiment in which a transistor of a super low threshold voltage specification is applied to the pull-down circuit NDRV0 in the sense amplifier circuit of FIG. 1.

FIG. 18 shows a sense amplifier circuit SA0 in a case of setting the threshold voltage of the pull-down circuit NDRV0 as an ultra low threshold voltage SLV. This is different from FIG. 1 in that the threshold voltage of the additional pull-down circuit NDRV0 is the ultra low threshold voltage SLV. Since the driving method and the layout method for the sense amplifier circuit in FIG. 18 are identical with those of Embodiment 1 in FIG. 1, description for them are omitted for the sake of simplicity.

As shown in FIG. 18, by setting the pull-down circuit NDRV0 to the ultra low threshold voltage SLV, gate-source voltage VGS of the NMOS transistor in the pull-down circuit NDRV0 can be ensured sufficiently high. When the gate to source voltage VGS can be ensured high, the amount of the read signal outputted from the memory cell to the data line can be amplified at a high speed by the pull-down circuit NDRV0. Further, since the gate to source voltage VGS of the pull-down circuit NDRV0 is ensured sufficiently high, even when the voltage of the data line high level voltage VARY is lowered, the amount of read signal can be amplified correctly by the pull-down circuit NDRV0. That is, since the voltage of the data line high level voltage VARY can be lowered, the data line charge/discharge current can be decreased and the chip consumption current can be decreased.

Embodiment 7

In Embodiment 6, while the threshold voltage of the pull-down circuit NDRV1 or the pull-up circuit PDRV is shown for the case of constitution with the value equal with the threshold voltage of usual thin film transistor used in the row decoder ROW DEC or the column decoder COLUMN DEC in the peripheral circuit, the threshold voltage for the pull-down circuit NDRV1 and the threshold voltage of the pull-up circuit PDRV may also be constituted by a low threshold voltage LV which is lower than the threshold voltage of a usual thin film transistor.

Figure 19:
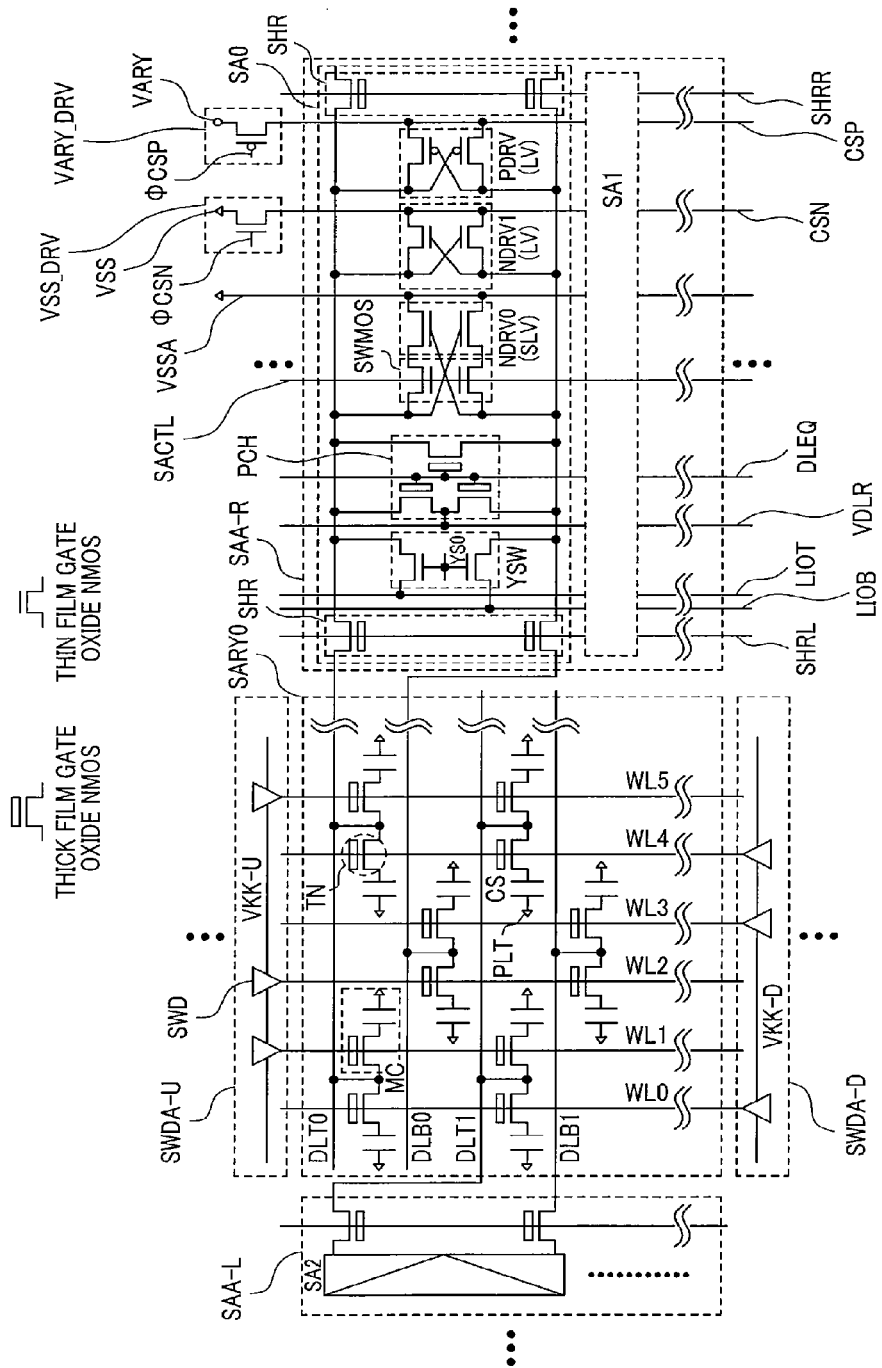
FIG. 19 shows a seventh embodiment in which a transistor of low threshold voltage specification is applied to the pull-down circuit NDRV1 and the pull-up circuit PDRV in the sense amplifier circuit of FIG. 18.

FIG. 19 shows the case of applying a low threshold voltage LV as the threshold voltage of the pull-down circuit NDRV1 and the pull-up circuit PDRV. Since the driving method and the plane layout method other than the application of the low threshold voltage LV are identical with those in Embodiment 6, descriptions for them are omitted.

As shown in FIG. 19, when a low threshold voltage LV is applied to the pull-down circuit NDRV1 and the pull-up circuit PDRV, the driving current for the pull-down circuit NDRV1 and the pull-up circuit PDRV can be increased. When the driving current can be increased, after amplifying the amount of read signal by the pull-down circuit NDRV0 to higher than the offset voltage of the pull-down circuit NDRV1 and the pull-up circuit PDRV, the speed of latching the data line to the data line high level VARY and the ground potential VSS can be increased. That is, the sensing speed can be increased and higher performance of the chip can be attained.

Figure 20:
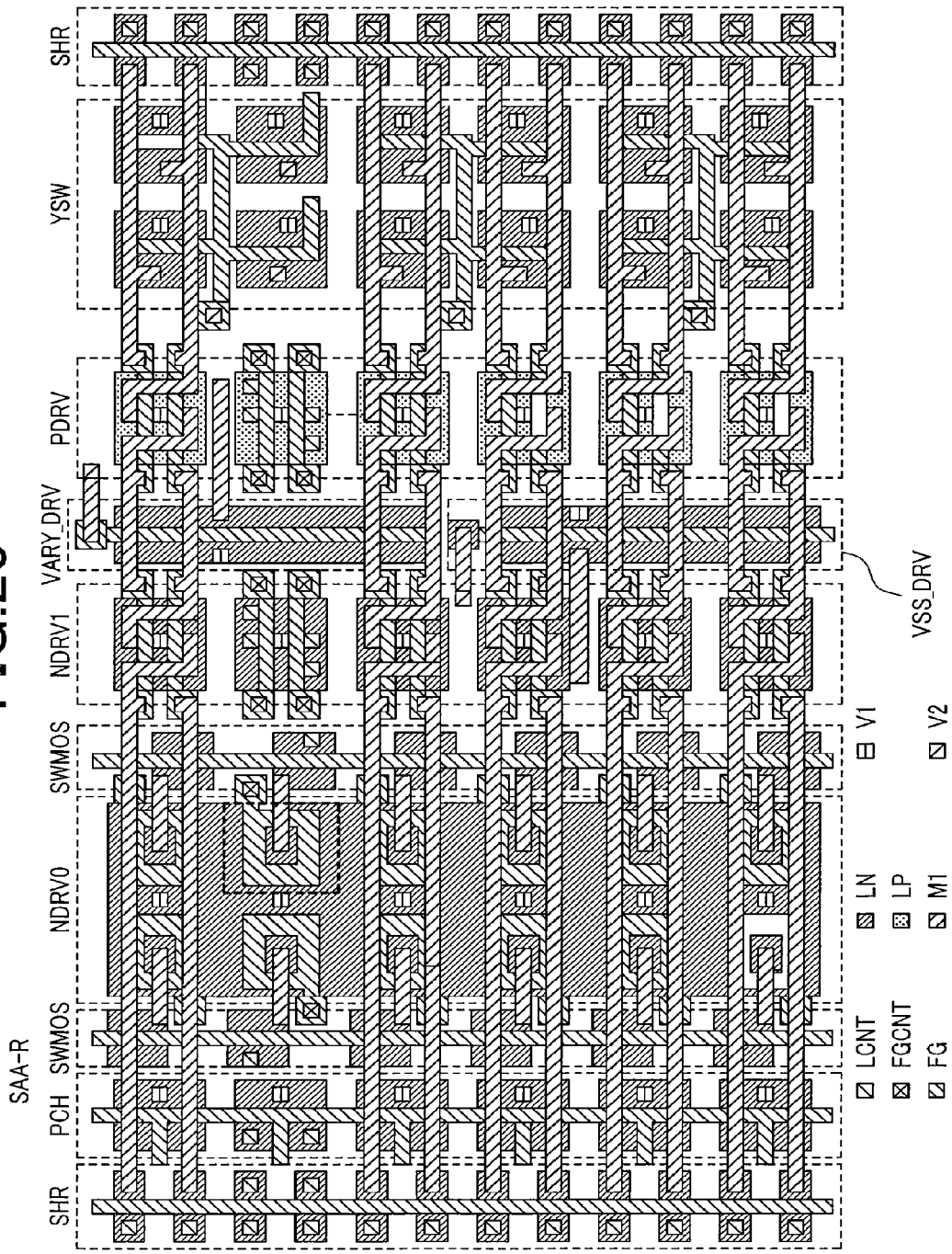
FIG. 20 is an example of a planar layout of the sense amplifier circuit practiced in FIG. 19.

FIG. 20 is an example of a planar layout for the sense amplifier circuit shown in FIG. 19. This is different from the planar layout in FIG. 3 in that the shape of the gate electrode of the pull-down circuit NDRV1 and the pull-up circuit PDRV is rectangular. In a case where the shape of the gate electrode is rectangular, the layout area of the pull-down circuit NDRV1 and pull-up circuit PDRV (length in the direction of the data line) can be decreased further in a case of ensuring an identical channel width than in a case of forming the gate electrode into a ring shape. Accordingly, since the layout area of the sense amplifier circuit SA0 can be decreased, it provides an advantage capable of decreasing the chip area and lowering the cost. In a case where the shape of the gate electrode is made rectangular, the manufacturing error is generally increased to sometimes increase the offset voltage. However, also in such a case, since the sense amplifier circuit SA0 of this embodiment can amplify the amount of read signal by the pull-down circuit NDRV0 to higher than the offset voltage of the pull-down circuit NDRV1 and pull-up circuit PDRV, it is apparent that there is no risk of generating the reading error.

Embodiment 8

In the embodiments described so far, while the switching transistor SWMOS is shown in a case of applying the usual thin film NMOS transistor used in the row decoder ROW DEC or the column decoder COLUMN DEC, the sense amplifier circuit SA0 may also be constituted by using an ultra low threshold voltage SLV.

Figure 21:
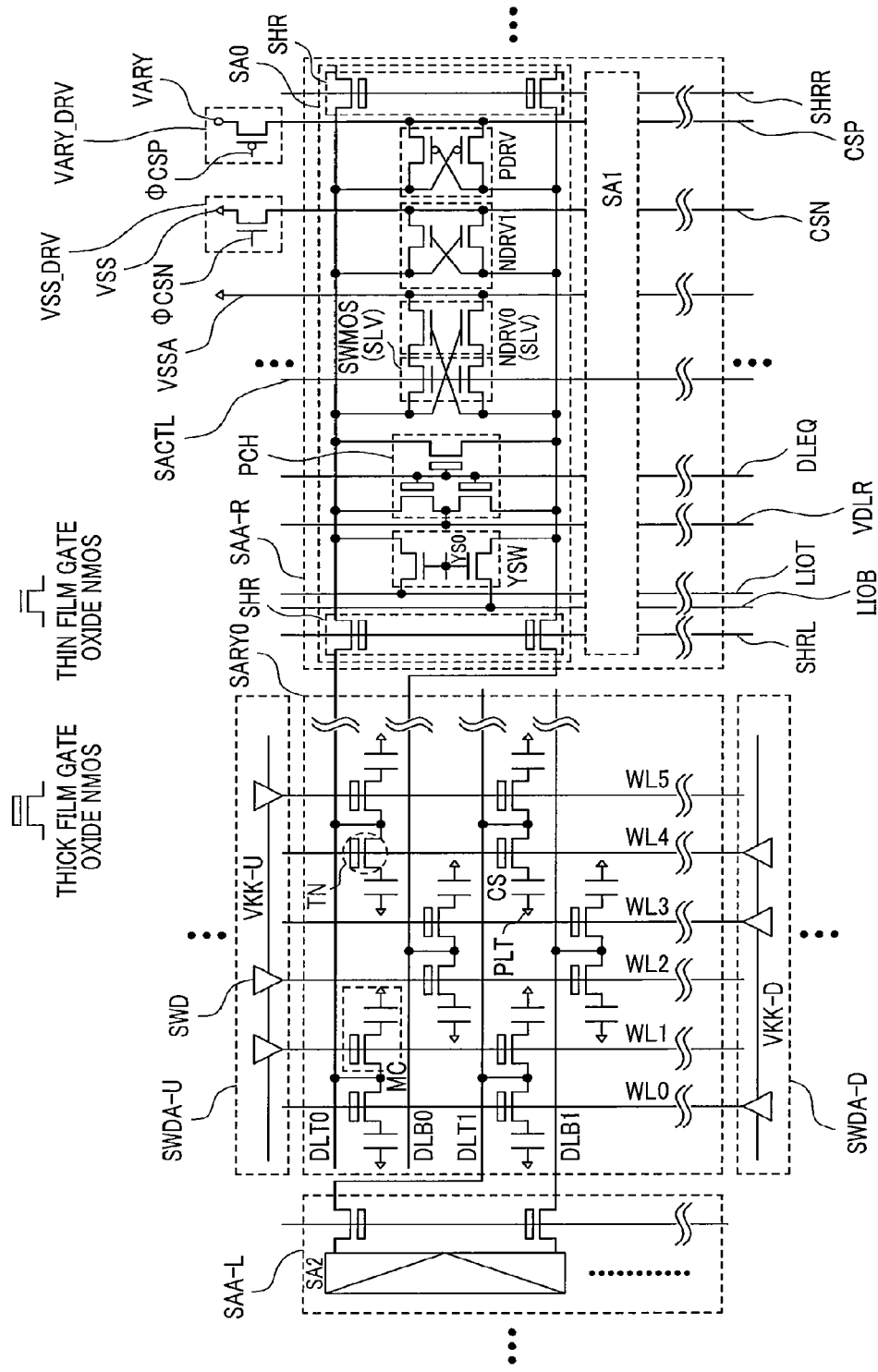
FIG. 21 shows an eighth embodiment of applying a transistor of a super low threshold voltage specification to the switching transistor and the pull-down circuit NDRV0 in the sense amplifier circuit of FIG. 1.

FIG. 21 shows a sense amplifier circuit in a case of setting the threshold voltage of the switching transistor SWMOS to the ultra low threshold voltage SLV. This is different from FIG. 18 in that the threshold voltage of the switching transistor SWMOS is constituted with the ultra low threshold voltage SLV. Since other driving methods and the plan layout views are identical with those in FIG. 18, descriptions are omitted.

By setting the switching transistor SWMOS to the ultra low threshold voltage SLV, a mask can be used in common for the pull-down circuit NDRV0 and for controlling the threshold voltage control. That is, the number of masks can be decreased by one compared with FIG. 18 and the manufacturing cost of the chip can be decreased. Further, since the threshold voltage is identical between the switching transistor SWMOS and the pull-down circuit NDRV0, it is not necessary to implant impurities for controlling the threshold voltage into the Si substrate at different impurity ion concentrations. That is, since it is not necessary for ensuring the distance between the masks for controlling the threshold voltage necessary for changing the threshold voltage for the switching transistor SWMOS and the pull-down circuit NDRV0, the sense amplifier circuit SA0 can be constituted with a layout area smaller than the layout area for the switching transistor SWMOS and the pull-down circuit NDRV0 in FIG. 18 and FIG. 19. Accordingly, this provides an advantage capable of further decreasing the chip size. Since the switching transistor SWMOS is set to the ultra low threshold voltage SLV, the subthreshold leak of the switching transistor SWMOS sometimes increases. In such a case, the stand-by gate voltage of the switching transistor SWMOS is preferably set, for example, to the negative voltage VKK. With such a constitution, the threshold voltage upon stand-by of the switching transistor SWMOS can be increased to provide an advantage capable of decreasing the subthreshold leakage current.

While a description has been made with reference to FIG. 1 to FIG. 21, the invention is not restricted to them. For example, a common source drier VOD_DRV may be added to the sense amplifier circuit SA0 in FIG. 19. With such a constitution, the driving current of the pull-up circuit PDRV can be increased to increase the sensing speed. Further, while a description has not been made with reference to the drawings, after latching the data on the data line, it may be controlled such that the once-inactivated switching transistor SWMOS is activated again by an identical timing with that for the column switch YSW. With such control, a driving force for driving the local input/output line LIO and the main input/output line MIO to the ground potential can be strengthened. In a case where the driving force of the sense amplifier can be strengthened, the speed of the cycle tCK between the column cycles can be increased to improve the data transfer rate between an external chip and the DRAM.

Since such a control method can be attained simply by the addition of a general logic circuit, a description with reference to the drawing is omitted. Further, although FIG. 6 shows a case of applying a general planar transistor as the memory cell transistor, it is not restricted thereto. A DRAM chip may also be constituted by applying a memory cell transistor of a so-called three-dimensional structure. With such a constitution, a higher performance DRAM capable of making the improvement in the retention time and increasing the speed of the access time tRCD compatible can be provided.

As described above, the sense amplifier circuit of the invention can be modified variously in accordance with low voltage operation, high speed operation and high degree of integration.

What is claimed is:

1. A semiconductor device comprising:
a memory array having a plurality of word lines, a plurality of data lines, and a plurality of memory cells arranged at respective intersections of the plurality of word lines and the plurality of data lines, and
a respective sense amplifier circuit connected to each of a plurality of data line pairs of the plurality of the data lines,
wherein the sense amplifier circuit has a first MISFET pair, a second MISFET pair, and a third MISFET pair,
the first and second MISFET pairs are of a first conduction type and the third MISFET pair is of a second conduction type which is opposite to the first conduction type,
a gate of one of the first MISFET pair and one of the data line pairs, which is included in the plurality of data lines and is provided corresponding to a drain of the other of the first MISFET pair, are connected with each other,
a gate of one of the second MISFET pair and a drain of the other of the second MISFET pair are connected with each other,
a gate of one of the third MISFET pair and a drain of the other of the third MISFET pair are connected with each other,
the first MISFET pair includes a first transistor having the first conduction type and a second transistor having the first conduction type,
the drain of the first transistor is connected with the source of a fourth MISFET having the first conduction type,
the drain of the second transistor is connected with the source of a fifth MISFET having the first conduction type,
drains of the fourth and fifth MISFETs are connected to the data line pair, respectively,
the fourth and fifth MISFETs are activated to drive the first MISFET pair preceding to the second MISFET pair and the third MISFET pair, and
the fourth and fifth MISFETs are inactivated before a corresponding one of the plurality of word lines is inactivated.

2. The semiconductor device according to claim 1, further comprising:
a plurality of column switches connected to each of the plurality of data lines,
wherein the fourth and fifth MISFETs are inactivated before a corresponding one of the plurality of column switches is activated.

3. The semiconductor device according to claim 2, wherein the fourth and fifth MISFETs are activated again by an identical timing with that of the corresponding one of the plurality of column switches.

4. The semiconductor device according to claim 1, wherein stand-by gate voltages of the fourth and fifth MISFETs are negative voltages.

5. The semiconductor device according to claim 1, further comprising:
a sub-word driver driving a corresponding one of the plurality of word lines,
wherein gate electrodes of the fourth and fifth MISFETs are connected to a wiring layer in a region where the sub-word driver and the sense amplifier circuit intersect each other.

* * * * *